(12) United States Patent
Lin et al.

(10) Patent No.: US 11,616,014 B2
(45) Date of Patent: Mar. 28, 2023

(54) PERIPHERAL INDUCTORS

(71) Applicant: Intel Corporation, Santa Clara, CA (US)

(72) Inventors: Kevin L. Lin, Beaverton, OR (US); Paul B. Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 52 days.

(21) Appl. No.: 16/638,907

(22) PCT Filed: Sep. 20, 2017

(86) PCT No.: PCT/US2017/052391
§ 371 (c)(1),
(2) Date: Feb. 13, 2020

(87) PCT Pub. No.: WO2019/059898
PCT Pub. Date: Mar. 28, 2019

(65) Prior Publication Data
US 2020/0365510 A1 Nov. 19, 2020

(51) Int. Cl.
| | | |
|---|---|---|
| H01L 23/522 | (2006.01) | |
| H01L 23/58 | (2006.01) | |
| H01L 27/06 | (2006.01) | |
| H01F 27/06 | (2006.01) | |
| H01L 23/00 | (2006.01) | |
| H01L 49/02 | (2006.01) | |
| H01F 41/00 | (2006.01) | |

(52) U.S. Cl.
CPC ......... *H01L 23/5227* (2013.01); *H01F 27/06* (2013.01); *H01L 23/564* (2013.01); *H01L 23/585* (2013.01); *H01L 24/16* (2013.01); *H01L 28/10* (2013.01); *H01F 41/00* (2013.01); *H01L 2224/16227* (2013.01); *H01L 2924/1206* (2013.01); *H01L 2924/14252* (2013.01)

(58) Field of Classification Search
CPC .................................................... H01L 23/5227
See application file for complete search history.

(56) References Cited

U.S. PATENT DOCUMENTS

| | | | |
|---|---|---|---|
| 6,509,622 B1 | 1/2003 | Ma et al. | |
| 8,072,042 B1* | 12/2011 | Kroener | H01L 27/08 |
| | | | 257/531 |
| 2006/0202269 A1 | 9/2006 | Suzuki et al. | |
| 2008/0230873 A1* | 9/2008 | Demircan | H01L 23/562 |
| | | | 257/620 |
| 2011/0133880 A1* | 6/2011 | Pitts | H01L 23/5227 |
| | | | 336/200 |

(Continued)

FOREIGN PATENT DOCUMENTS

| | | |
|---|---|---|
| KR | 101630055 B1 | 6/2016 |
| WO | 2019059898 A1 | 3/2019 |

OTHER PUBLICATIONS

PCT International Search Report and Written Opinion issued in PCT Application No. PCT/US2017/052391 dated Dec. 28, 2017; 12 pages.

*Primary Examiner* — Omar F Mojaddedi
(74) *Attorney, Agent, or Firm* — Akona IP PC

(57) ABSTRACT

Disclosed herein are peripheral inductors for integrated circuits (ICs), as well as related methods and devices. In some embodiments, an IC device may include a die having an inductor extending around at least a portion of a periphery of the die.

17 Claims, 13 Drawing Sheets

(56) References Cited

U.S. PATENT DOCUMENTS

| | | | |
|---|---|---|---|
| 2011/0248811 A1 | 10/2011 | Kireev | |
| 2012/0187530 A1* | 7/2012 | Zhang | H01L 27/0694 |
| | | | 257/532 |
| 2012/0319236 A1* | 12/2012 | Chen | H01L 23/5227 |
| | | | 257/E21.575 |
| 2014/0231956 A1* | 8/2014 | Smeloy | H01L 23/5227 |
| | | | 438/381 |
| 2014/0268616 A1* | 9/2014 | Lan | H01L 27/016 |
| | | | 361/782 |
| 2014/0354392 A1* | 12/2014 | Cooney, III | H01L 23/5329 |
| | | | 336/200 |
| 2015/0014031 A1* | 1/2015 | Lin | H01L 23/49833 |
| | | | 174/258 |
| 2017/0178791 A1* | 6/2017 | Pornin | H01L 23/645 |
| 2019/0057942 A1* | 2/2019 | Male | H01L 28/10 |

* cited by examiner

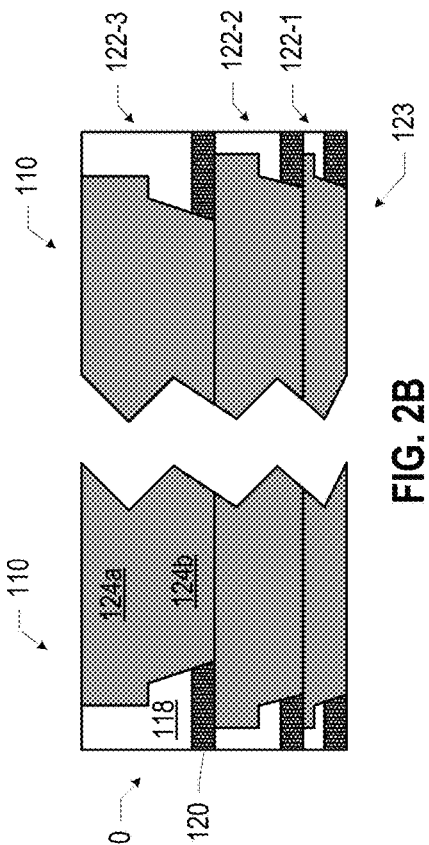
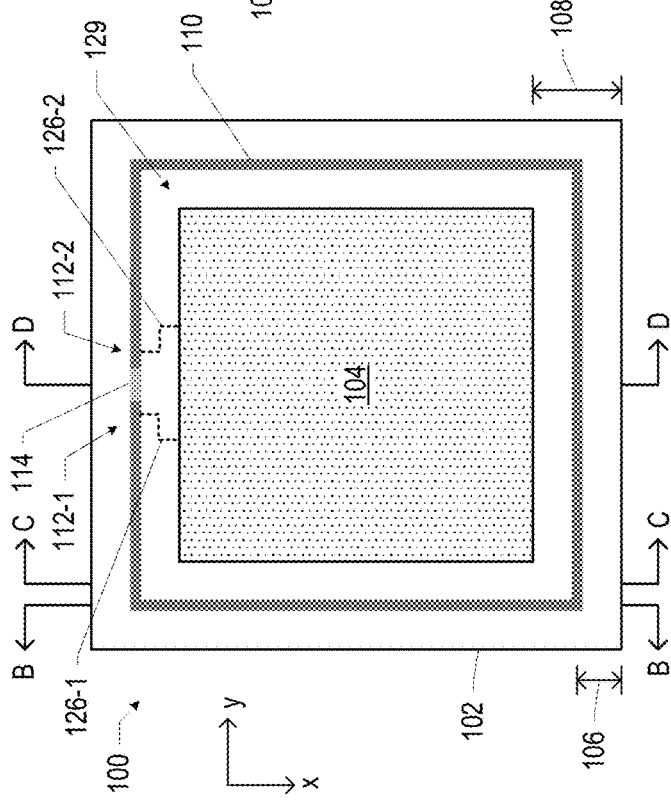
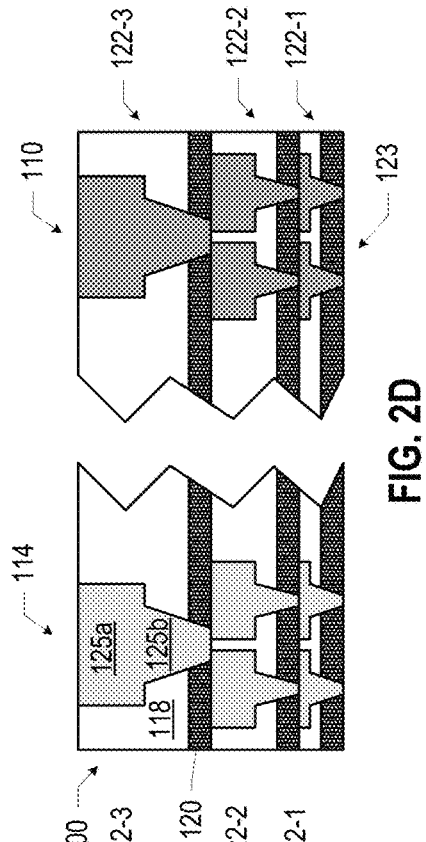
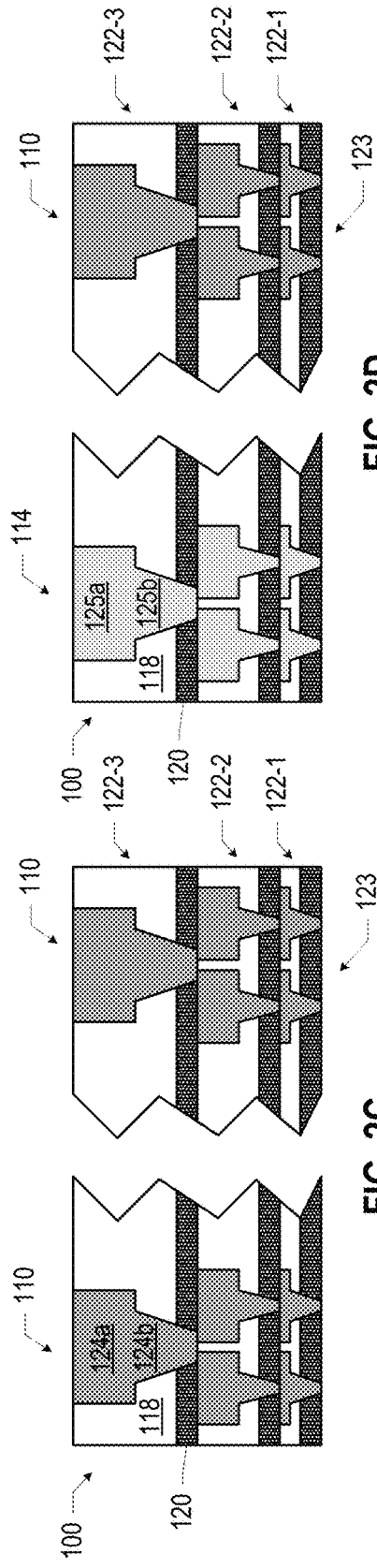
FIG. 2A
FIG. 2B
FIG. 2C
FIG. 2D

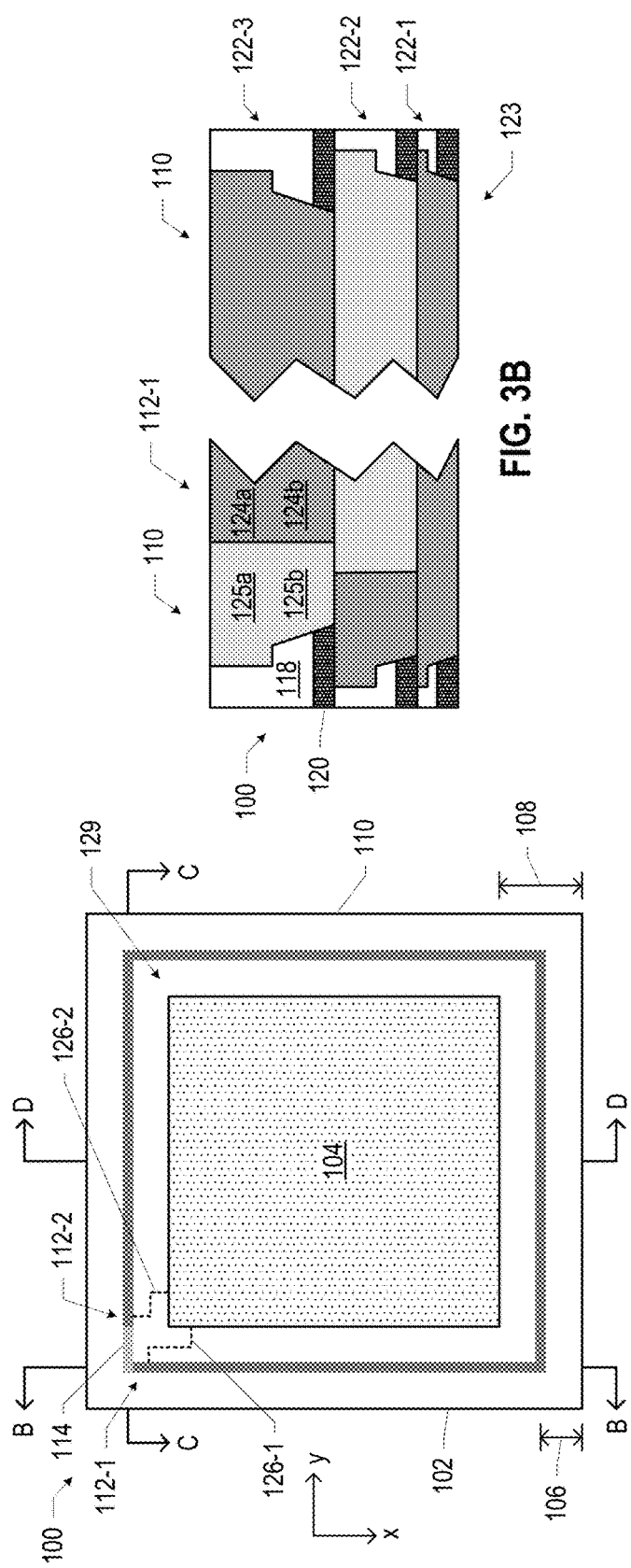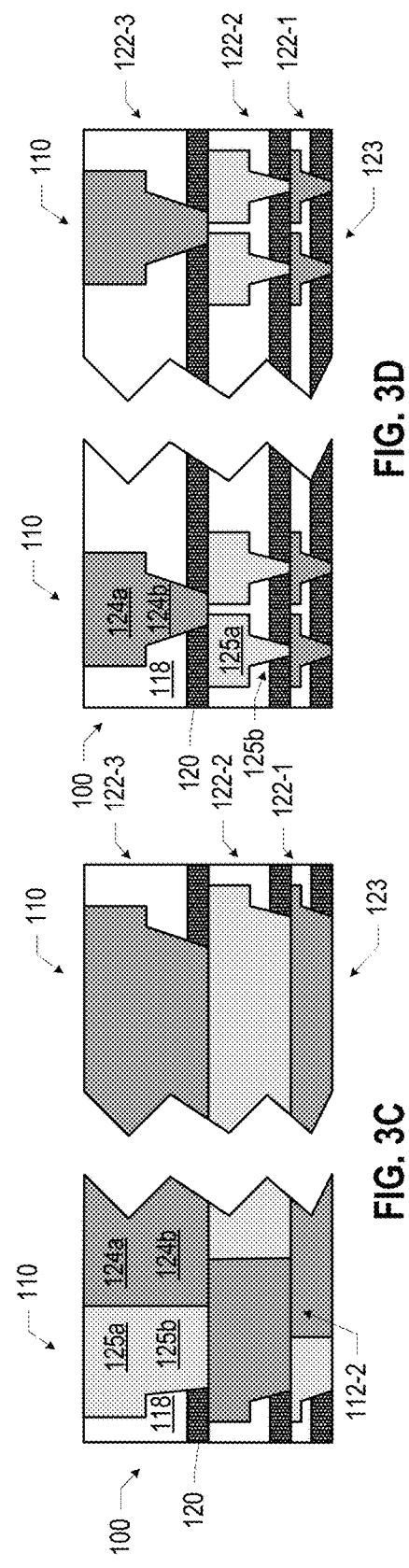
FIG. 3A
FIG. 3B
FIG. 3C
FIG. 3D

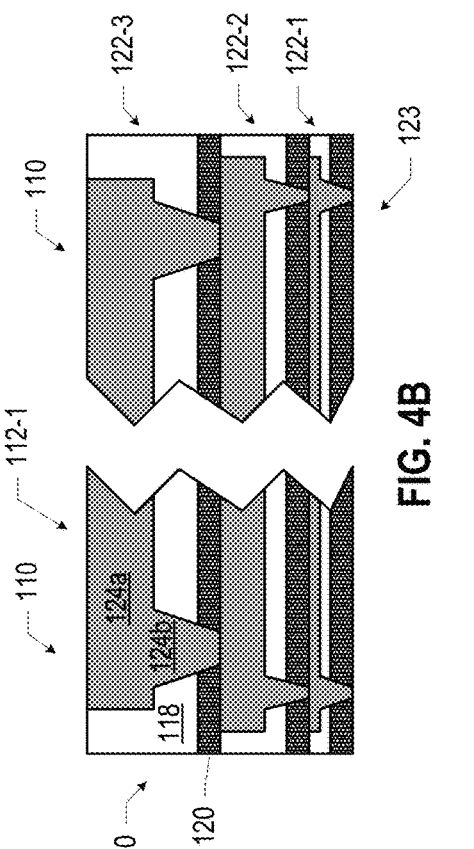
FIG. 4A
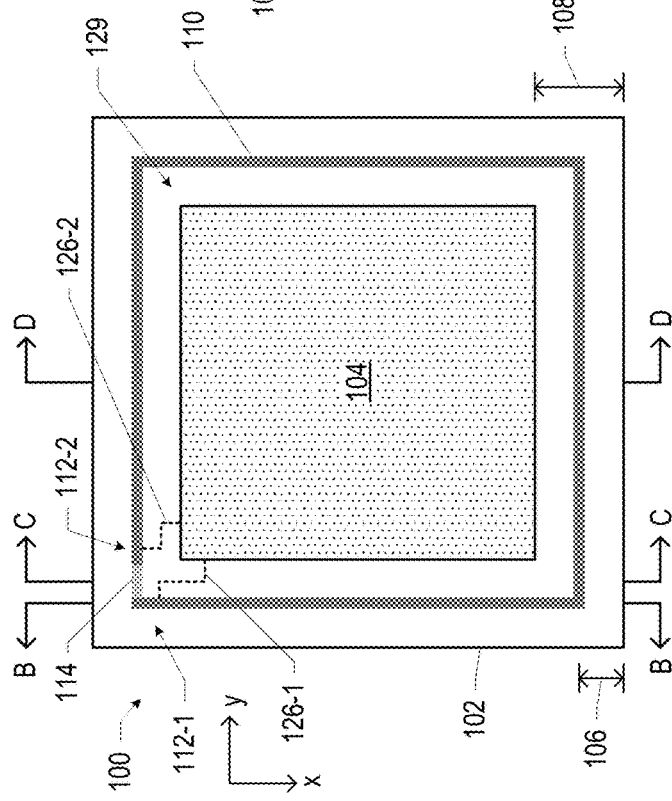
FIG. 4B
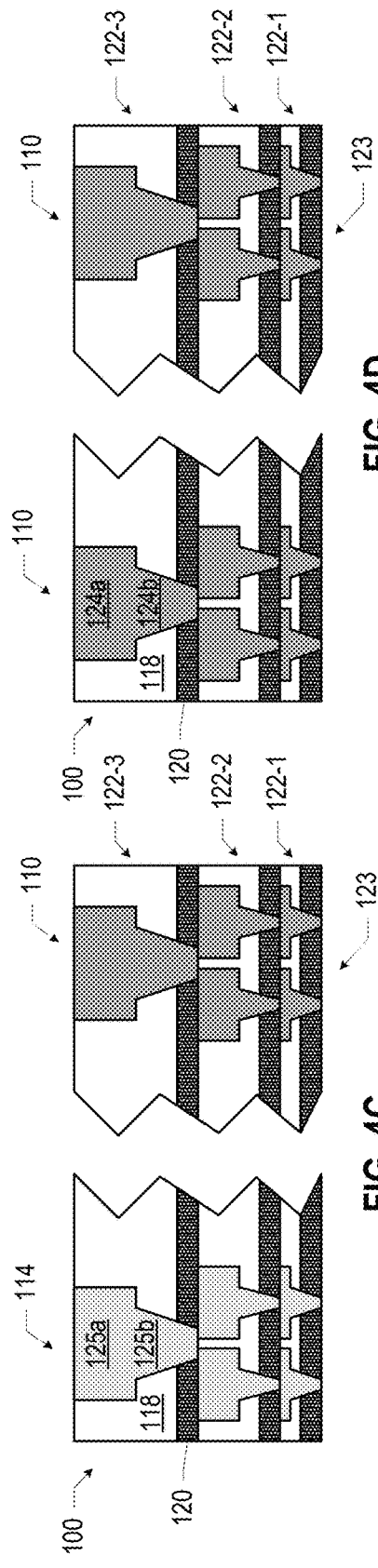
FIG. 4C
FIG. 4D

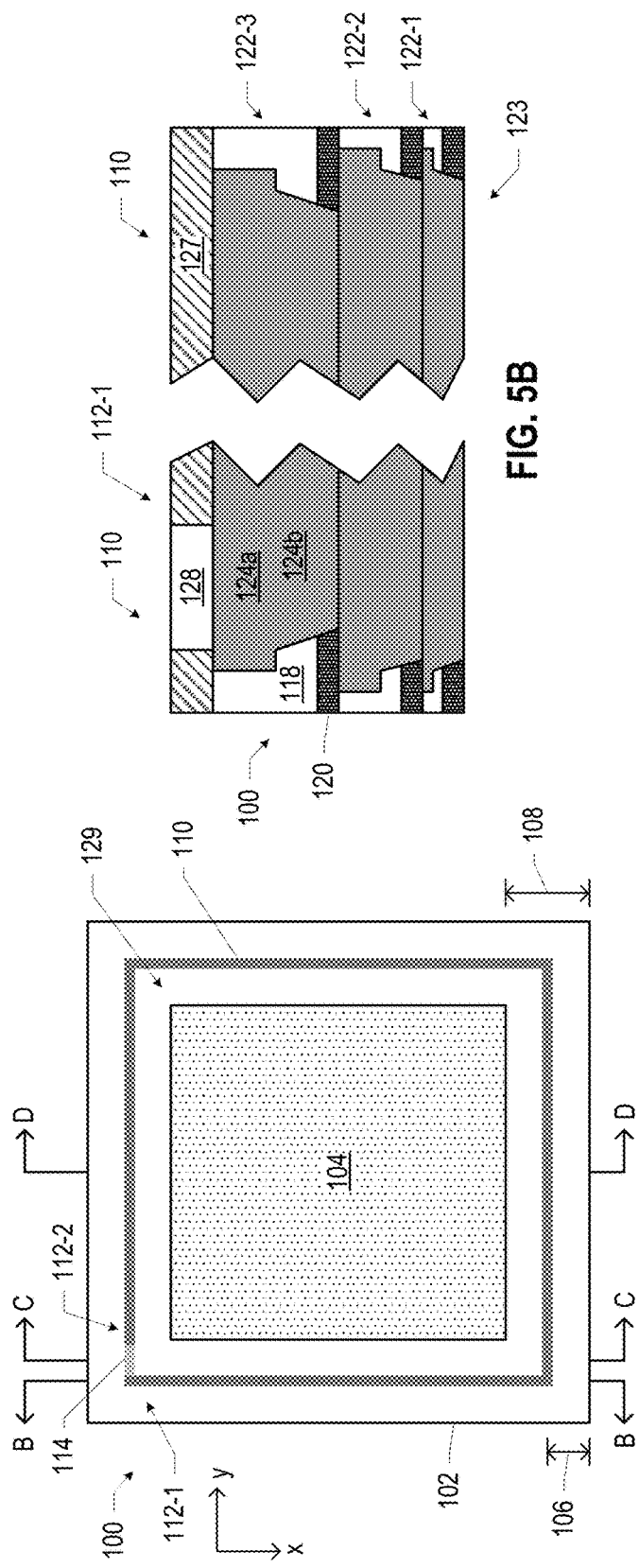

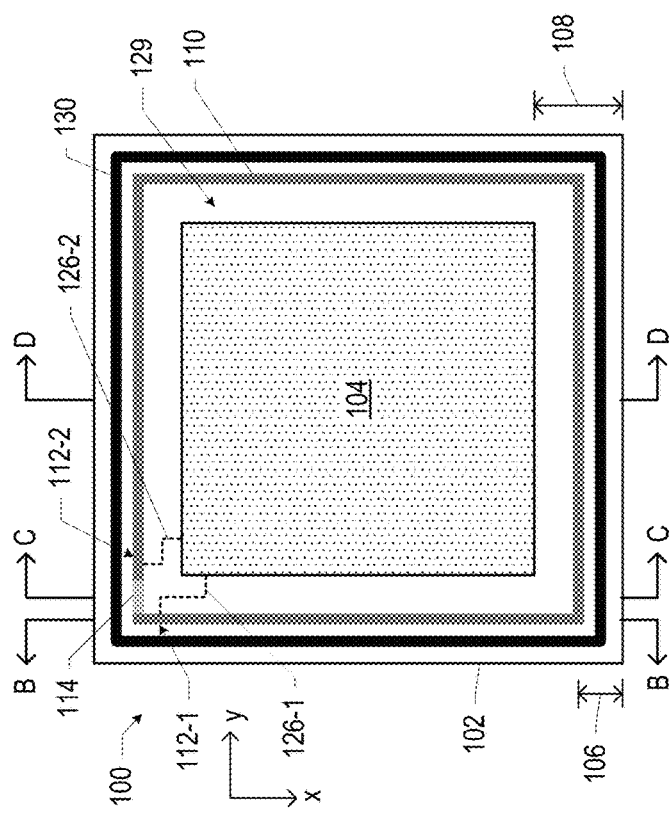
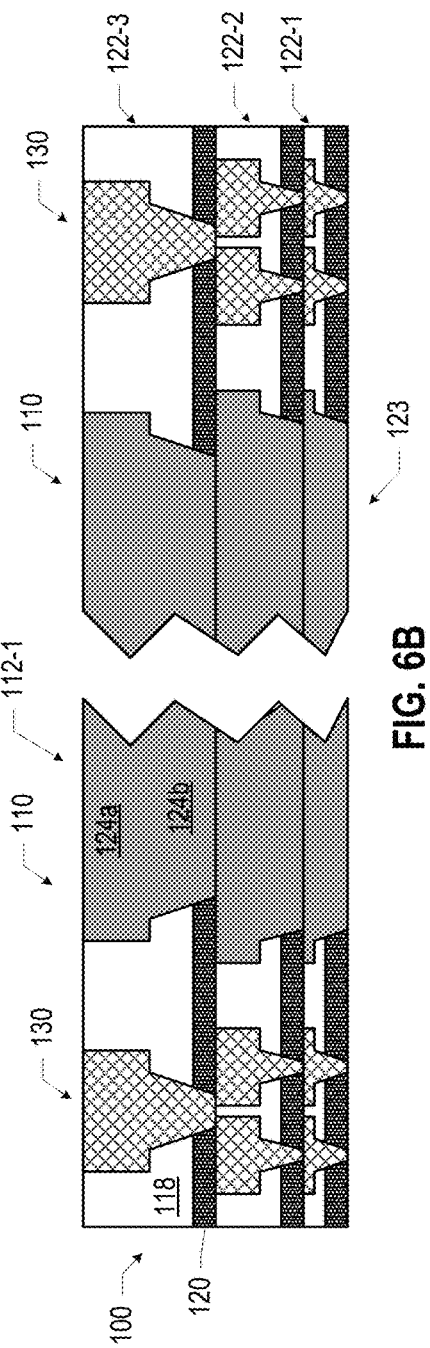
FIG. 6A
FIG. 6B

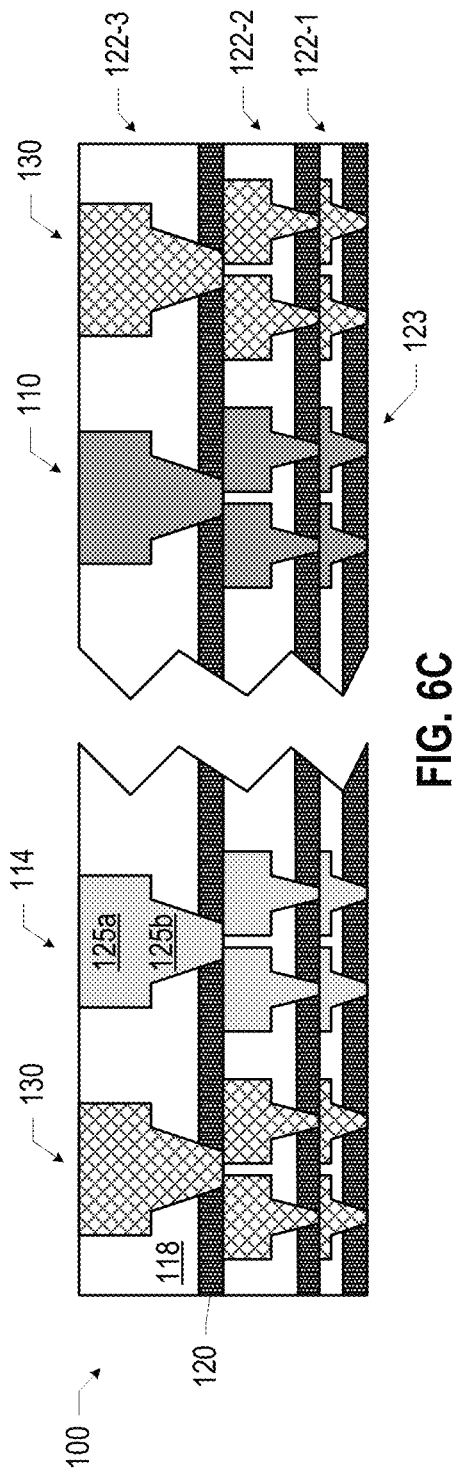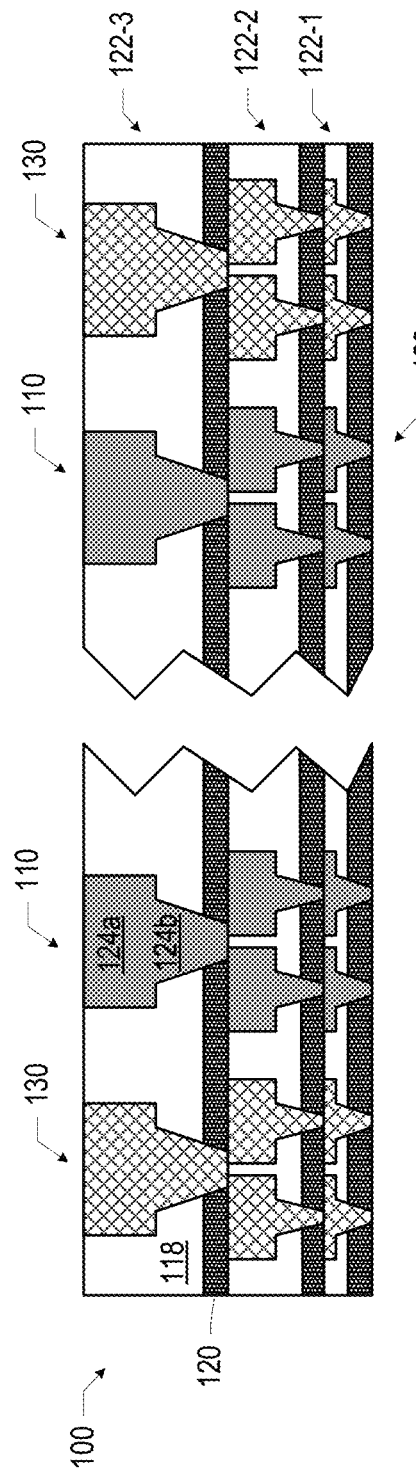
FIG. 6C
FIG. 6D

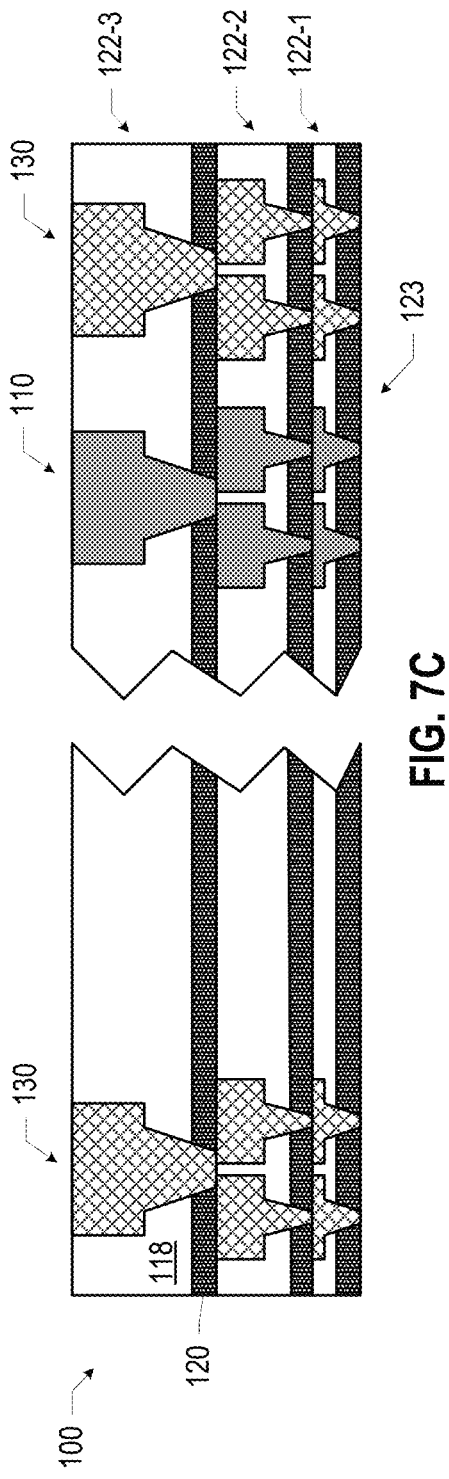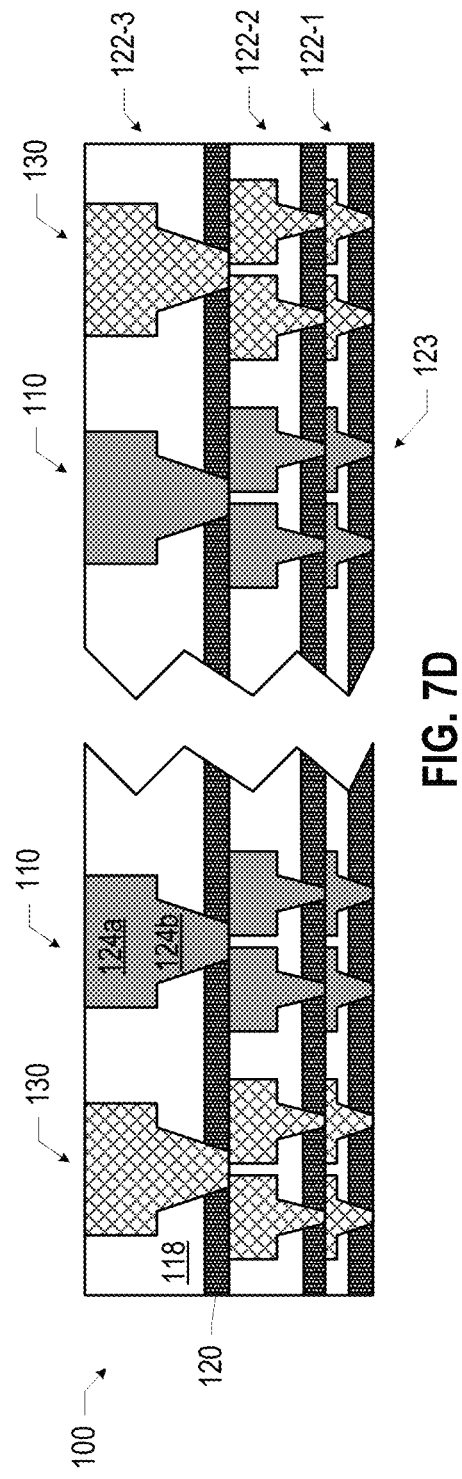

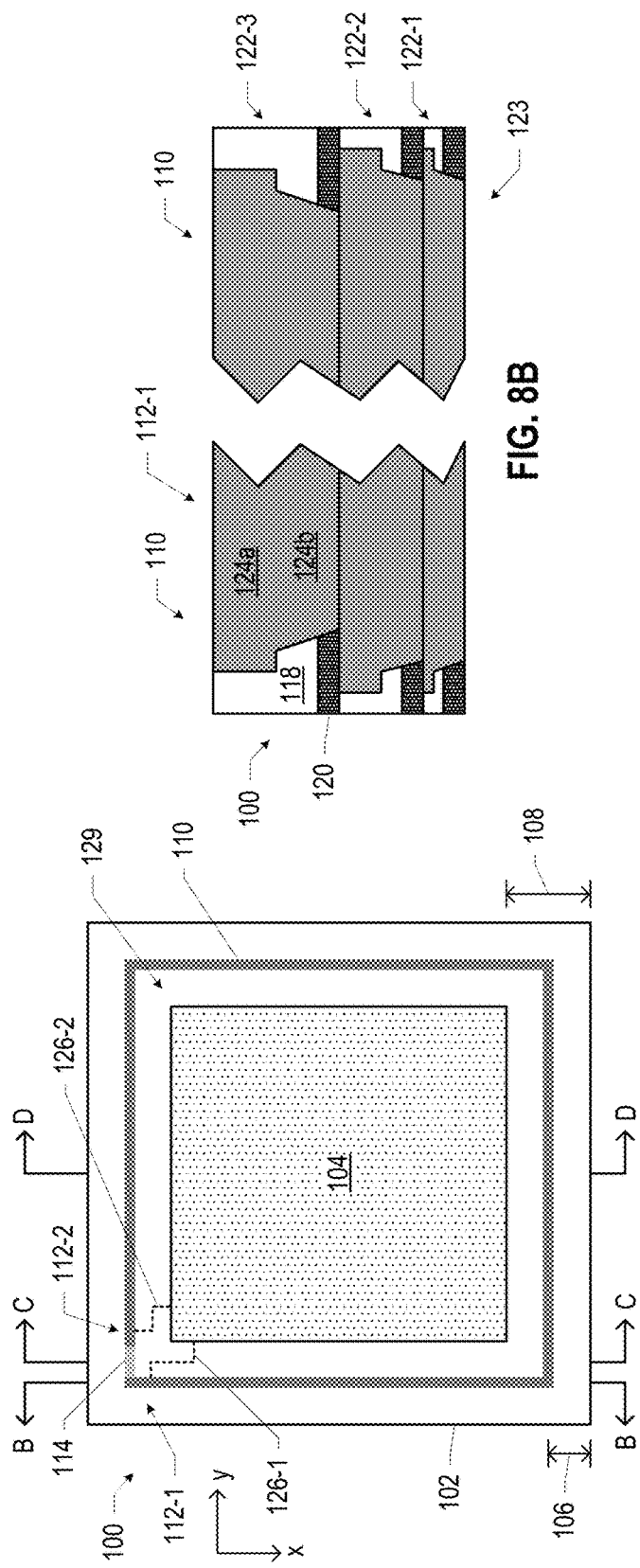
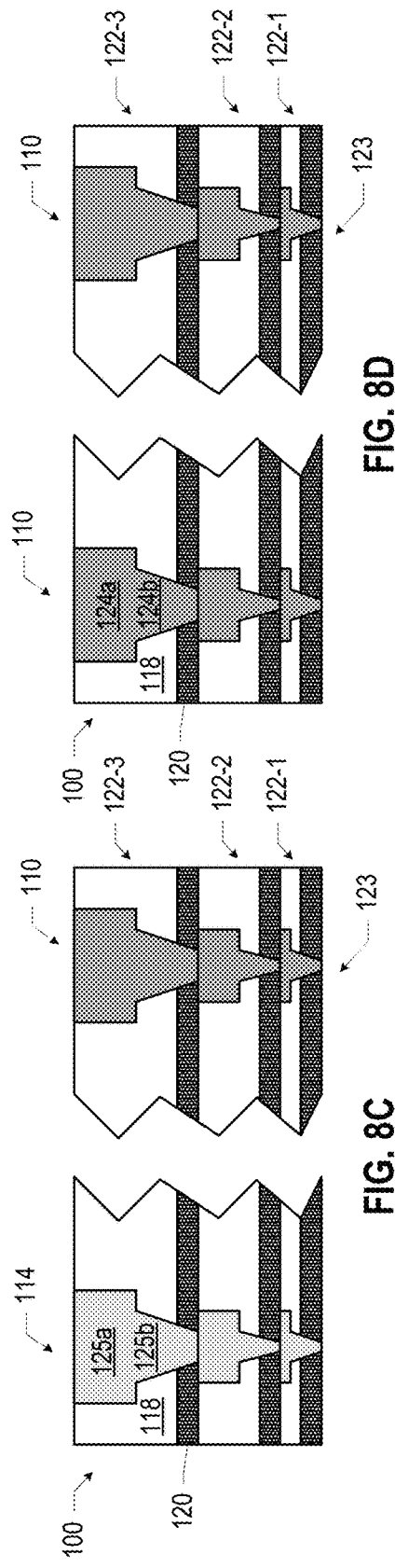
FIG. 8A
FIG. 8B
FIG. 8C
FIG. 8D

PERIPHERAL INDUCTORS

CROSS-REFERENCE TO RELATED APPLICATION

This application is a national stage application under 35 U.S.C. § 371 of PCT International Application Serial No. PCT/US2017/052391, filed on Sep. 20, 2017 and entitled "PERIPHERAL INDUCTORS," which is hereby incorporated by reference herein in its entirety.

BACKGROUND

Some integrated circuit (IC) devices may include inductors (e.g., as part of power circuitry). Inductors may be formed by a length of conductive material shaped as a loop with one or more turns.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 1A-1D, 2A-2D, 3A-3D, 4A-4D, 5A-5D, 6A-6D, 7A-7D, and 8A-8D are various views of a die including a peripheral inductor, in accordance with various embodiments.

DETAILED DESCRIPTION

Figure 1B:
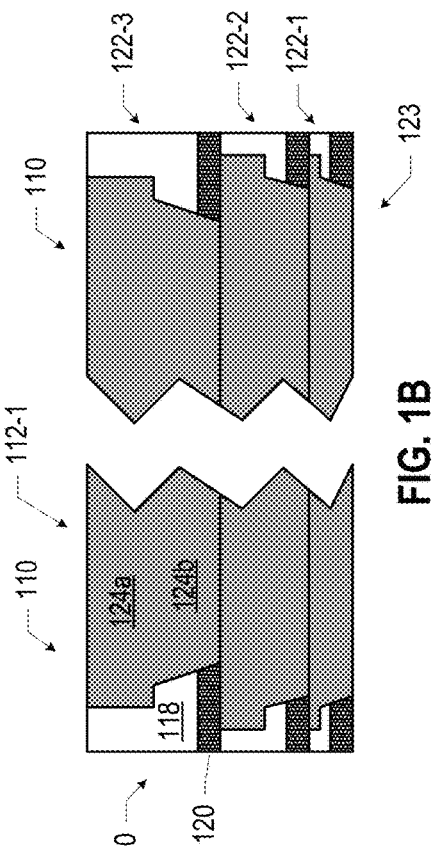

Disclosed herein are peripheral inductors for integrated circuits (ICs), as well as related methods and devices. In some embodiments, an IC device may include a die having an inductor extending around at least a portion of a periphery of the die.

The inductance of an inductor is proportional to, among other things, the area within its turns. To achieve a large enough inductance (e.g., for power circuitry applications, such as buck-boost converters), inductors have conventionally taken up a lot of room within an IC device. Attempting to reduce the volume of an inductor by reducing the thickness of its "wire" may result in an undesirable increase in the resistance of the inductor. Inductors have therefore been a limiting factor in reducing the size of an IC device.

Various ones of the peripheral inductors disclosed herein may be located in the periphery of a die, and loop around circuitry in the interior of the die. Some such peripheral inductors may utilize regions of the die that were previously underutilized, reducing the achievable footprint of the die. Some embodiments of the peripheral inductors disclosed herein may form a part of a guard ring to mitigate mechanical damage to a die and thus enabling further size reductions.

The term "peripheral inductor" may be used in this description to describe various ones of the conductive structures disclosed herein, but any of the peripheral inductors disclosed herein may be used for purposes different from, or in addition to, inductors. For example, the conductive structures described herein as "peripheral inductors" may instead be used in an IC component (e.g., in a die, package substrate, or interposer, for example) as part of an electromagnetic shield for an electromagnetically sensitive portion of the IC component. In another example, the conductive structures described herein as "peripheral inductors" may instead be used in an IC component as part of a thermal management structure, such as a heat fin or spreader. Thus, it will be understood that any of the conductive structures described herein as "peripheral inductors" may alternately or additionally be used in an IC component for other purposes.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. As used herein, the term "insulating" refers to "electrically insulating" (e.g., non-conductive)

For convenience, the phrase "FIG. 1" may be used to refer to the collection of drawings of FIGS. 1A-1D, the phrase "FIG. 2" may be used to refer to the collection of drawings of FIGS. 2A-2D, etc. A number of the figures include multiple ones of different elements (e.g., multiple conductive lines 124*a* and conductive vias 124*b*, etc.); for clarity of illustration, some but not all of these elements may be labeled in the figures.

Figure 1D:
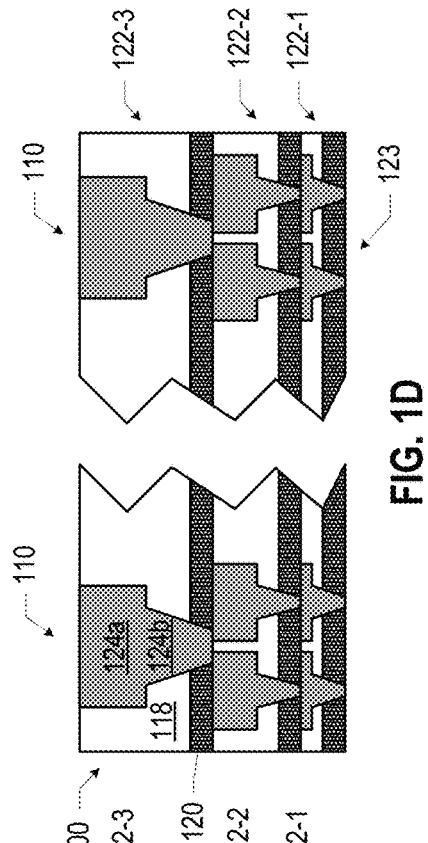
Figure 1A:
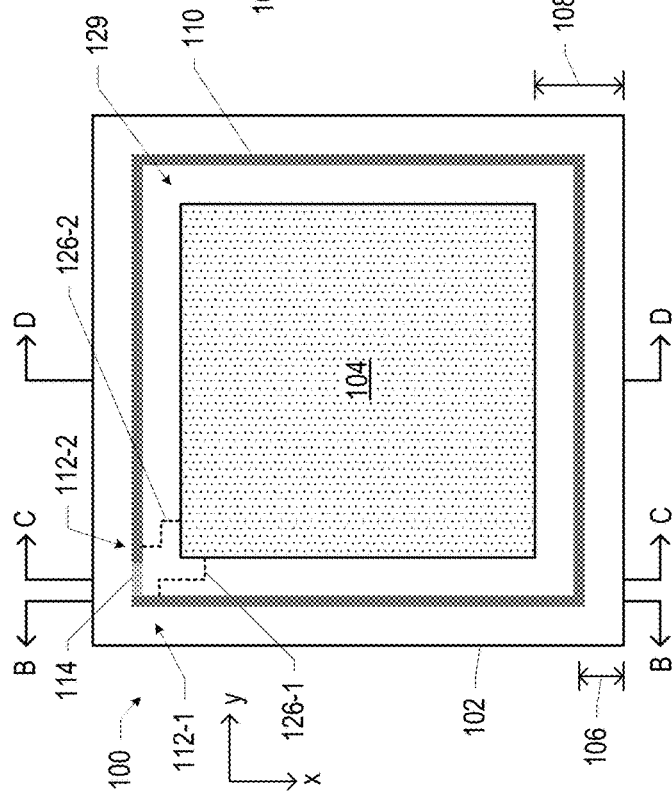
Figure 1C:
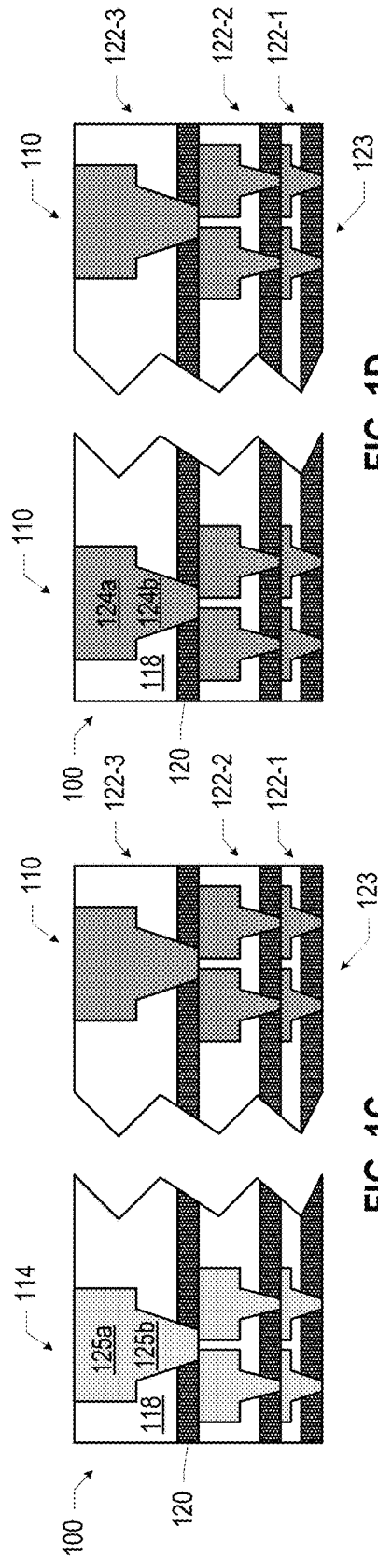

FIGS. 1A-1D are various views of a die 100 including a peripheral inductor 110, in accordance with various embodiments. In particular, FIG. 1A is a top cross-sectional view of the die 100, FIG. 1B is a side cross-sectional view of a portion of a metallization stack 123 of the die 100 through the section B-B of FIG. 1A, FIG. 1C is a side cross-sectional view of a portion of the metallization stack 123 of the die 100 through the section C-C of FIG. 1A, and FIG. 1D is a side cross-sectional view of a portion of the metallization stack 123 of the die 100 through the section D-D of FIG. 1A. Note that FIGS. 1B-1D (and other of the cross-sectional views herein, as indicated) omit a view of the circuitry 104 in the interior 129 of the peripheral inductor 110 so as to illustrate example structures in the peripheral inductor 110 more clearly.

The die 100 may include circuitry 104 and one or more peripheral inductors 110. A single peripheral inductor 110 is shown in FIG. 1 (and others of the accompanying figures), but this is simply for ease of illustration, and a die 100 may include multiple peripheral inductors 110. The circuitry 104 may be disposed in an interior 129 of the peripheral inductor 110; as used herein, the "interior 129" may refer to the portion of the die 100 whose footprint in the z-direction is within the footprint of the peripheral inductor 110. As discussed below with reference to FIG. 10, the die 100 may be one of many dies 100 singulated from a wafer; each of the dies 100 formed from a wafer may include a peripheral inductor 110 proximate to the edges 102 of the dies 100. As discussed further below with reference to FIG. 11, the circuitry 104 may include one or more transistors (e.g., some of the transistors 1640 of FIG. 11, discussed below) or other active devices, passive devices (e.g., capacitors, inductors, or resistors), interconnects (e.g., the interconnect structures 1628 discussed below with reference to FIG. 11), memory devices (e.g., a random access memory (RAM) device, such as a static RAM (SRAM) device, a magnetic RAM (MRAM) device, a resistive RAM (RRAM) device, a conductive-bridging RAM (CBRAM) device, etc.), logic devices (e.g., an AND, OR, NAND, or NOR gate), and/or any other suitable circuit element. The drawings of FIG. 1 are simplified to illustrate various features of the peripheral inductor 110; the die 100 (including elements omitted from the drawings of FIG. 1) is discussed in further detail below with reference to FIGS. 9 and 10.

The peripheral inductor 110 may extend through the periphery of the die 100, around the interior 129, and proximate to two or more edges 102 of the die 100. As illustrated in FIG. 1, the peripheral inductor 110 may be proximate to all four sides of the die 100. In some embodiments, the peripheral inductor 110 may wrap around the interior 129 of the die 100 more than once, forming a "spiral" with multiple turns, as discussed below with reference to FIG. 3. The inductance of the peripheral inductor 110 may be a function of the number of turns of the peripheral inductor 110, the length of the peripheral inductor 110, and the area of the interior 129 of the peripheral inductor 110, as known in the art. In some embodiments, the distance 106 between an edge 102 of the die 100 and a proximate portion of the peripheral inductor 110 (e.g., as indicated in FIG. 1A) may be between 10 microns and 500 microns. In some embodiments, the distance 108 between an edge 102 of the die 100 and the circuitry 104 (in the interior 129 of the peripheral inductor 110) may be between 10 microns and 500 microns.

The peripheral inductor 110 may not be a closed electrical loop but may have an end 112-1 and an end 112-2. In some embodiments, the end 112-1 may be electrically coupled to the circuitry 104 by a conductive pathway 126-1 (including any of the interconnect structures 1628 discussed below), and/or the end 112-2 may be electrically coupled to the circuitry 104 by a conductive pathway 126-2. In some embodiments, the end 112-1 and/or the end 112-2 may not be directly electrically coupled to the circuitry 104 but may instead be electrically coupled to conductive contacts 128 at a face of the die 100 (as discussed further below with reference to FIG. 5). Note that the conductive pathways 126 may not be physically in contact with the material ends 112 of the peripheral inductor 110 but may contact the peripheral inductor 110 proximate to the ends 112.

The peripheral inductor 110 may be disposed in one or more of the interconnect layers 122 of the metallization stack 123. As discussed below with reference to FIG. 11, the metallization stack 123 may include interconnects (not shown) that route signals (e.g., electrical signals, such as power and/or input/output (I/O) signals) in the die 100. Examples of such interconnects are discussed below with reference to FIG. 11.

The peripheral inductor 110 may include conductive segments 124. The conductive segments 124 may include conductive lines 124*a* and conductive vias 124*b*. The conductive lines 124*a* may be arranged to route electrical signals in a direction of a plane that is substantially parallel with a surface of the substrate upon which the die 100 is formed (e.g., as discussed below with reference to FIG. 11). For example, the conductive lines 124*a* may route electricity in the peripheral inductor 110 in a direction in and out of the page from the perspective of FIGS. 1C and 1D and left to right in the page from the perspective of FIG. 1B. The conductive vias 124*b* may route electricity in the peripheral inductor 110 in a direction of a plane that is substantially perpendicular to the surface of the substrate upon which the die 100 is formed (e.g., in the z-direction, in accordance with the coordinate system of FIG. 1). The conductive vias 124*b* illustrated in FIG. 1 are line vias, providing a "wall" that extends into and out of the plane of the drawings of FIGS. 1C and 1D and along the plane of the drawing of FIG. 1B. A line via, formed by lithography, may be contrasted with a circular via, which has a circular footprint and may be conventionally formed by laser or mechanical drilling. Embodiments of peripheral inductors 110 that include circular conductive vias 124*b* are discussed below with reference to FIG. 4. In some embodiments, the conductive vias 124*b* may electrically couple conductive lines 124*a* of different interconnect layers 122 together. Any suitable conductive material may be used in the peripheral inductor 110, such as copper, tungsten, or titanium.

FIG. 1 illustrates three interconnect layers, 122-1, 122-2, 122-3. These interconnect layers 122 may be the "bottom-most" interconnect layers 122 in the metallization stack 123 (i.e., the M1, M2, and M3 layers discussed below with reference to FIG. 11) or they may represent three consecutive layers that are "higher up" in the metallization stack 123. In the embodiment of FIG. 1, the peripheral inductor 110 spans all three of the interconnect layers 122-1, 122-2, and 122-3; this is simply illustrative, and in other embodiments, a peripheral inductor 110 may span fewer than three interconnect layers 122 or more than three interconnect layers 122.

The interconnect layers 122 may include a dielectric material 118 disposed between the conductive segments 124, as shown in FIG. 1. In some embodiments, the dielectric material 118 disposed between the conductive segments 124 in different ones of the interconnect layers 122 may have different compositions; in other embodiments, the composition of the dielectric material 118 between different interconnect layers 122 may be the same. The dielectric material 118 may be an interlayer dielectric, such as an oxide (e.g., silicon oxide). In some embodiments, each interconnect layer may also include a layer of nitride material 120 (e.g., to serve as etch stops during fabrication). In some embodiments, an adhesion liner (not shown) may be disposed between conductive material and proximate insulating material of the die 100 to improve mechanical adhesion between the conductive material and the insulating material. In some embodiments, a diffusion barrier (not shown) may be disposed between conductive material and proximate insulating material of the die 100 to reduce undesirable diffusion of conductive material into the proximate insulating material.

In some embodiments, the interconnect layers 122 that are "higher up" in the metallization stack 123 in the die 100 (i.e., further away from the device layer discussed below with reference to FIG. 11) may be thicker, as illustrated in FIG. 1. The conductive segments 124 may be formed using any suitable technique, such as additive, subtractive, semi-additive, Damascene, or dual Damascene fabrication.

In the embodiment of FIG. 1 (and other ones of the figures), the peripheral inductor 110 is shown as having a branched structure along its thickness; a top portion of the peripheral inductor 110 is in interconnect layer 122-3 and includes a single conductive line 124a and a single conductive via 124b, while the middle and bottom portions of the peripheral inductor 110 (in the interconnect layers 122-2 and 122-1, respectively) each include two conductive lines 124a and conductive vias 124b. The design constraints on conductive lines 124a and conductive vias 124b in a metallization stack 123 may be such that the conductive segments 124 are constrained to be smaller in the "lower" interconnect layers 122. Thus, in order to achieve a substantially uniform width for the peripheral inductor 110 across multiple interconnect layers 122, this type of branching may be used. The particular arrangement and number of branches shown in FIG. 1 is simply illustrative, and any suitable arrangement and number may be used. In some embodiments, a peripheral inductor 110 may not have a branched structure along its thickness (e.g., as discussed below with reference to FIG. 8).

In the embodiment of FIG. 1, the two ends 112 of the peripheral inductor 110 may be spaced apart by a portion of insulating material 114. In some embodiments, the insulating material 114 may include insulating segments 125. The insulating segments 125 may include insulating lines 125a and insulating vias 125b. The insulating lines 125a may extend in a direction of a plane that is substantially parallel with a surface of the substrate upon which the die 100 is formed (e.g., as discussed below with reference to FIG. 11). For example, the insulating lines 125a may extend in a direction in and out of the page from the perspective of FIG. 1C, and left to right in the page from the perspective of FIG. 1A. The insulating vias 125b may be line vias, as discussed above, and may extend in a direction of a plane that is substantially perpendicular to the surface of the substrate upon which the die 100 is formed (e.g., in the z-direction, in accordance with the coordinate system of FIG. 1). The insulating vias 125b of FIG. 1 may form a "wall" (instead of having a circular footprint, as would circular vias). In some embodiments, the insulating vias 125b may extend between insulating lines 125a of different interconnect layers 122. In some embodiments, the insulating lines 125a and the insulating vias 125b may have the same dimensions as the conductive lines 124a and the conductive vias 124b in the same interconnect layer 122. Although FIG. 1 illustrates an embodiment with a single section of insulating material 114, other embodiments may include multiple sections of insulating material 114 (e.g., as discussed below with reference to FIG. 3).

In some embodiments, the insulating material 114 and the peripheral inductor 110 together may act as a guard ring around the periphery of the die 100. A guard ring may provide mechanical protection to the die 100 during singulation by providing a "wall" against which cracks and other mechanical defects (arising, e.g., during singulation) may terminate, protecting the structures within the interior of the guard ring (e.g., the circuitry 104). In some embodiments, a guard ring may act as a hermetic seal between these interior structures and the external environment, with the conductive lines 124a, line-type conductive vias 124b, insulating lines 125a, and line-type insulating vias 125b providing a solid "wall."

The insulating material 114 may be a dielectric material that is different from the dielectric material 118. In embodiments in which the guard ring provides a hermetic seal, the insulating material 114 may be a nitride (e.g., silicon nitride, or other nitrides that may be traditionally be used as etch stop films) or another suitable material. In other embodiments, a guard ring may not provide a hermetic seal (and may include, for example, circular conductive vias 124b and/or circular insulating vias 125b).

In some embodiments in which a peripheral inductor 110 and accompanying insulating material 114 may together provide a guard ring, a separate guard ring may not be included. Such embodiments may thus improve dies that are to include a guard ring by adding inductor functionality to the guard ring. In other embodiments, a die 100 may include both a peripheral inductor 110 and a guard ring (e.g., as discussed below with reference to FIGS. 6 and 7).

In some embodiments, the peripheral inductors 110 disclosed herein may be operated at sufficiently low frequencies to avoid interference with the operation of the circuitry 104 (or other proximate circuitry). In some embodiments, the peripheral inductors 110 may be operated at a frequency between 10 hertz and 500 kilohertz (e.g., between 50 hertz and 60 hertz for power applications, such as buck-boost converters).

FIGS. 2-7 illustrate additional example peripheral inductors 110. Any of the features discussed with reference to any of FIGS. 1-7 herein may be combined with any other features to form a peripheral inductor 110. For example, as discussed further below, FIG. 2 illustrates an embodiment in which the two ends 112 of a peripheral inductor 110 are located close to the center of an edge 102 of the die 100 (instead of in a corner of the die 100, as shown in FIG. 1), and FIG. 3 illustrates an embodiment in which the peripheral inductor 110 has a "spiral" shape in the z-direction. These features of FIGS. 2 and 3 may be combined so that a peripheral inductor 110, in accordance with the present disclosure, has two ends 112 located close to the center of an edge 102 and also has a spiral shape in the z-direction. This particular combination is simply an example, and any combination may be used. A number of elements of FIG. 1 are shared with FIGS. 2-7; for ease of discussion, a description of these elements is not repeated, and these elements may take the form of any of the embodiments disclosed herein.

In some embodiments, the ends 112 of a peripheral inductor 110 may not be located proximate to a corner of the die 100. FIGS. 2A-2D are various views of an example of a die 100 including such a peripheral inductor 110, in accordance with various embodiments. In particular, FIG. 2A is a top cross-sectional view of the die 100, FIG. 2B is a side cross-sectional view of a portion of a metallization stack 123 of the die 100 through the section B-B of FIG. 2A, FIG. 2C is a side cross-sectional view of a portion of the metallization stack 123 of the die 100 through the section C-C of FIG. 2A, and FIG. 2D is a side cross-sectional view of a portion of the metallization stack 123 of the die 100 through the section D-D of FIG. 2A.

As noted above, in FIG. 2, the two ends 112 of the peripheral inductor 110 are located away from the corners of the die 100 (as was shown in FIG. 1) and closer to the center of an edge 102. The insulating material 114 is thus also located closer to the center of an edge 102. More generally, the ends 112 of a peripheral inductor 110 and the insulating material 114 may be located at any suitable location along the periphery of the die 100.

In some embodiments, a die 100 may include a peripheral inductor 110 that makes multiple turns. FIGS. 3A-3D are various views of an example of a die 100 including such a peripheral inductor 110, in accordance with various embodiments. In particular, FIG. 3A is a top cross-sectional view of the die 100, FIG. 3B is a side cross-sectional view of a portion of a metallization stack 123 of the die 100 through the section B-B of FIG. 3A, FIG. 3C is a side cross-sectional view of a portion of the metallization stack 123 of the die 100 through the section C-C of FIG. 3A, and FIG. 3D is a side cross-sectional view of a portion of the metallization stack 123 of the die 100 through the section D-D of FIG. 3A.

As noted above, the peripheral inductor 110 of FIG. 3 has a "spiral" shape, originating at the end 112-1 in the interconnect layer 122-3, extending through the interconnect layer 122-2 with a segment of conductive line 124a and conductive via 124b, and terminating at the end 112-2 in the interconnect layer 122-1. The peripheral inductor 110 of FIG. 3 thus includes approximately two turns; this structure may be extended into additional interconnect layers 122 to form peripheral inductors 110 that include more than two turns. The insulating material 114 is present proximate to the end 112-1 in the interconnect layer 122-3, in the interconnect layer 122-2 between the two turns of the peripheral inductor 110, and at the end 112-2 in the interconnect layer 122-1. Relative to the peripheral inductor 110 of FIG. 1, the peripheral inductor 110 includes more turns, increasing its inductance. However, the peripheral inductor 110 of FIG. 3 is also "thinner" in the z-direction (having a thickness approximately equal to the height of one interconnect layer 122, rather than three interconnect layers 122 like the embodiment of FIG. 1) and thus may exhibit greater parasitic resistance during operation. In some embodiments, the peripheral inductor 110 of FIG. 3 may be made "thicker" than illustrated in FIG. 3 by using more than one interconnect layer 122 to provide its thickness (e.g., having the thickness of the peripheral inductor 110 extend through two interconnect layers 122, causing the entire peripheral inductor 110 to occupy five or more interconnect layers 122). The thickness of the layer of insulating material 114 between different turns of the peripheral inductor 110 may be equal to, greater than, or less than the thickness of each of the turns.

In some embodiments, a peripheral inductor 110 may include circular conductive vias 124b (and may include circular insulating vias 125b). FIGS. 4A-4D are various views of an example of a die 100 including such a peripheral inductor 110, in accordance with various embodiments. In particular, FIG. 4A is a top cross-sectional view of the die 100, FIG. 4B is a side cross-sectional view of a portion of a metallization stack 123 of the die 100 through the section B-B of FIG. 4A, FIG. 4C is a side cross-sectional view of a portion of the metallization stack 123 of the die 100 through the section C-C of FIG. 4A, and FIG. 4D is a side cross-sectional view of a portion of the metallization stack 123 of the die 100 through the section D-D of FIG. 4A.

In the embodiment of FIG. 4, the conductive vias 124b are not line vias (as is illustrated in FIGS. 1-3) but are circular vias. Similarly, the insulating vias 125b are not line vias but are circular vias. The combination of the peripheral inductor 110 and the insulating material 114 may not provide a hermetic seal for the die 100 but may still act as a guard ring to mitigate crack propagation. The spacing of the conductive vias 124b and insulating vias 125b may be selected to achieve a desired porosity of the peripheral inductor 110/insulating material 114 guard ring. In some embodiments, the peripheral inductor 110 and insulating material 114 of FIG. 3 may not act as a guard ring.

In some embodiments, a die 100 may include a conductive pathway between at least one end 112 of a peripheral inductor 110 and a conductive contact at a face of the die 100. FIGS. 5A-5D are various views of an example of such a die 100 including a peripheral inductor 110, in accordance with various embodiments. In particular, FIG. 5A is a top cross-sectional view of the die 100, FIG. 5B is a side cross-sectional view of a portion of a metallization stack 123 of the die 100 through the section B-B of FIG. 5A, FIG. 5C is a side cross-sectional view of a portion of the metallization stack 123 of the die 100 through the section C-C of FIG. 5A, and FIG. 5D is a side cross-sectional view of a portion of the metallization stack 123 of the die 100 through the section D-D of FIG. 5A.

In the embodiment of FIG. 5, the peripheral inductor 110 is in electrical contact with at least one conductive contact 128 at a top surface of the die 100. In such embodiments, the peripheral inductor 110 may be "used" by an external component (e.g., a circuit board or another die) coupled to the die 100 via the conductive contacts 128. FIG. 5 depicts the peripheral inductor 110 in direct contact with a conductive contact 128, but, in some embodiments, the electrical connection may extend through one or more conductive lines and/or vias. A solder resist material 127 (e.g., a polyimide or a similar material) may be disposed at the top surface of the die 100 with one or more conductive contacts 128 formed on the interconnect layers 122. In FIG. 5, the conductive contact 128 is illustrated as taking the form of a bond pad. Conductive contacts 128 may be electrically coupled with the peripheral inductor 110 and/or the interconnect structures in the circuitry 104 (e.g., discussed below with reference to FIG. 11) and may be configured to route electrical signals between the die 100 and other external devices (not shown). For example, solder bonds may be formed on the one or more conductive contacts 128 to mechanically and/or electrically couple the die 100 with another component (e.g., a circuit board). The die 100 may include additional or alternate structures to route electrical signals from the interconnect layers 122; for example, the conductive contacts 128 may include other analogous features (e.g., posts) that route electrical signals between the die 100 and external components.

In some embodiments, a die 100 may include a peripheral inductor 110 and a separate guard ring. FIGS. 6A-6D are various views of an example of such a die 100 including a peripheral inductor 110, in accordance with various embodiments. In particular, FIG. 6A is a top cross-sectional view of the die 100, FIG. 6B is a side cross-sectional view of a portion of a metallization stack 123 of the die 100 through the section B-B of FIG. 6A, FIG. 6C is a side cross-sectional view of a portion of the metallization stack 123 of the die 100 through the section C-C of FIG. 6A, and FIG. 6D is a side cross-sectional view of a portion of the metallization stack 123 of the die 100 through the section D-D of FIG. 6A.

In the embodiment of FIG. 6, the die 100 may include a guard ring 130 that extends around the periphery of the die 100 such that the peripheral inductor 110 is within an interior of the guard ring 130. The guard ring 130 may include conductive lines and conductive vias and may be constructed in accordance with any suitable ones of the embodiments disclosed herein with reference to the peripheral inductors 110). In some embodiments, the guard ring 130 may provide a solid wall against cracks or other mechanical defects (e.g., by being formed of conductive lines and line-type conductive vias, as discussed above); in some such embodiments, the guard ring 130 may provide a hermetic seal against the exterior environment. In some embodiments, the guard ring 130 may be porous (and may include circular conductive vias), as discussed above with reference to the peripheral inductor 110 of FIG. 4. The guard ring 130 may be formed of a conductive material (e.g., the same material as the peripheral inductor 110) or an insulating material (e.g., the same material as discussed herein with reference to the insulating material 114). In the embodiment of FIG. 6, the insulating material 114 may be present between the ends 112 of the peripheral inductor 110.

Figure 7A:
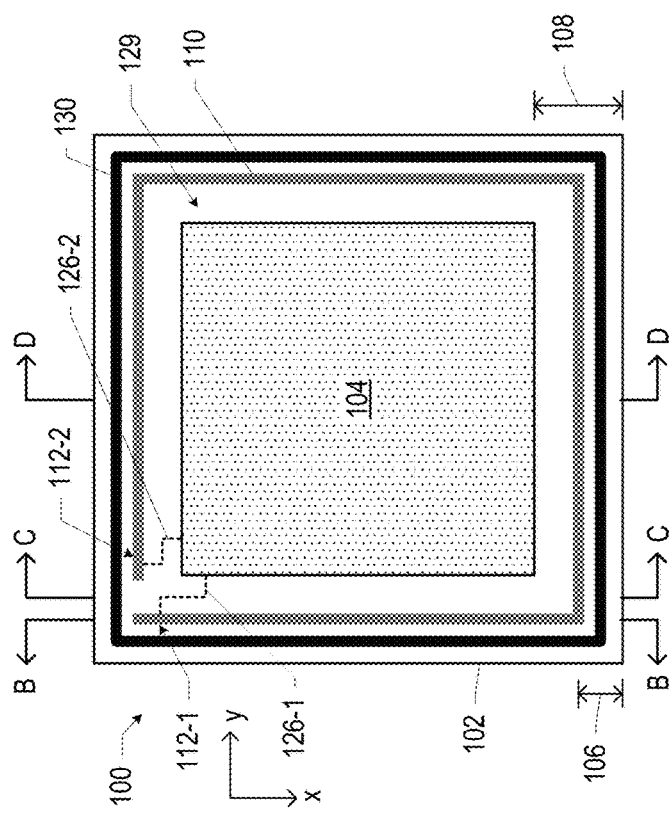
Figure 7B:
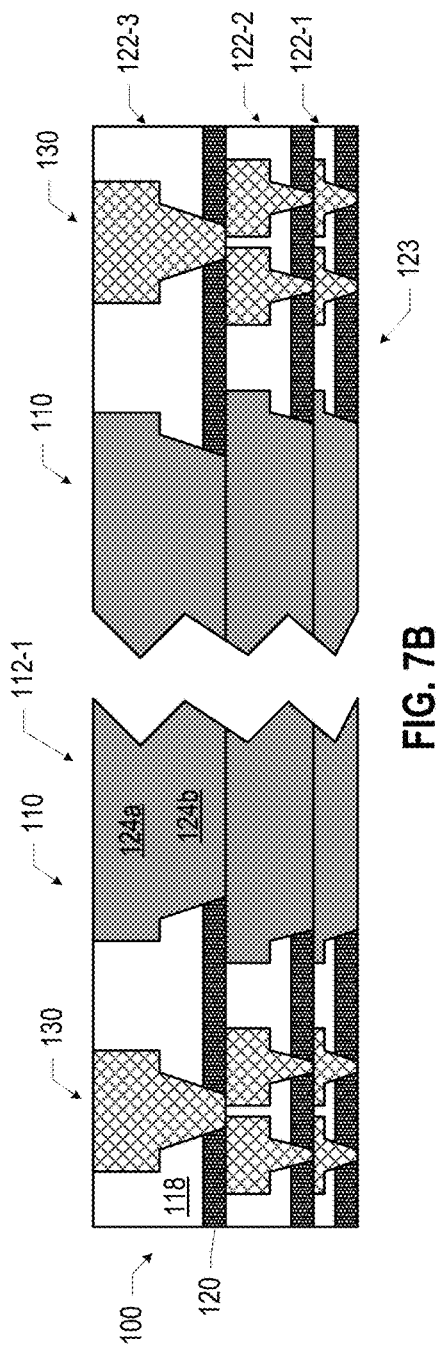

In some embodiments in which a die 100 includes both a peripheral inductor 110 and a separate guard ring 130, the peripheral inductor 110 may not include a portion of insulating material 114 having insulating lines 125a and/or insulating vias 125b. FIGS. 7A-7D are various views of an example of such a die 100 including a peripheral inductor 110, in accordance with various embodiments. In particular, FIG. 7A is a top cross-sectional view of the die 100, FIG. 7B is a side cross-sectional view of a portion of a metallization stack 123 of the die 100 through the section B-B of FIG. 7A, FIG. 7C is a side cross-sectional view of a portion of the metallization stack 123 of the die 100 through the section C-C of FIG. 7A, and FIG. 7D is a side cross-sectional view of a portion of the metallization stack 123 of the die 100 through the section D-D of FIG. 7A.

In the embodiment of FIG. 7, no insulating lines 125a and/or insulating vias 125b may be present. Instead, the dielectric material 118 of the interconnect layers 122 may be present proximate to the ends 112 of the peripheral inductor 110. Such an embodiment may be appropriate when the separate guard ring 130 provides an appropriate wall or hermetic seal. In some embodiments, the peripheral inductor 110 may have a spiral structure like that discussed above with reference to FIG. 3, but no insulating lines 125a/insulating vias 125b of the insulating material 114 may be present; instead, the dielectric material 118 may separate adjacent turns of the peripheral inductor, be proximate to the ends 112 of the peripheral inductor 110, etc.

As noted above, in some embodiments, a peripheral inductor 110 may not have a branched structure along its thickness, but may instead have a structure in which conductive lines 125a and conductive vias 125b are substantially centered and aligned to form a column. FIGS. 8A-8D are various views of an example of a die 100 including such a peripheral inductor 110, in accordance with various embodiments. In particular, FIG. 8A is a top cross-sectional view of the die 100, FIG. 8B is a side cross-sectional view of a portion of a metallization stack 123 of the die 100 through the section B-B of FIG. 8A, FIG. 8C is a side cross-sectional view of a portion of the metallization stack 123 of the die 100 through the section C-C of FIG. 8A, and FIG. 8D is a side cross-sectional view of a portion of the metallization stack 123 of the die 100 through the section D-D of FIG. 2A.

In the embodiment of FIG. 8, a top portion of the peripheral inductor 110 is in interconnect layer 122-3 and includes a single conductive line 124a and a single conductive via 124b, while the middle and bottom portions of the peripheral inductor 110 (in the interconnect layers 122-2 and 122-1, respectively) each also include a single conductive line 124a and conductive via 124b (forming a single "column"). The particular arrangement shown in FIG. 8 is simply illustrative, and any suitable arrangement and number may be used. More generally, any suitable arrangement of conductive lines 124a and conductive vias 124b may be used to form a peripheral inductor 110.

Figure 9:
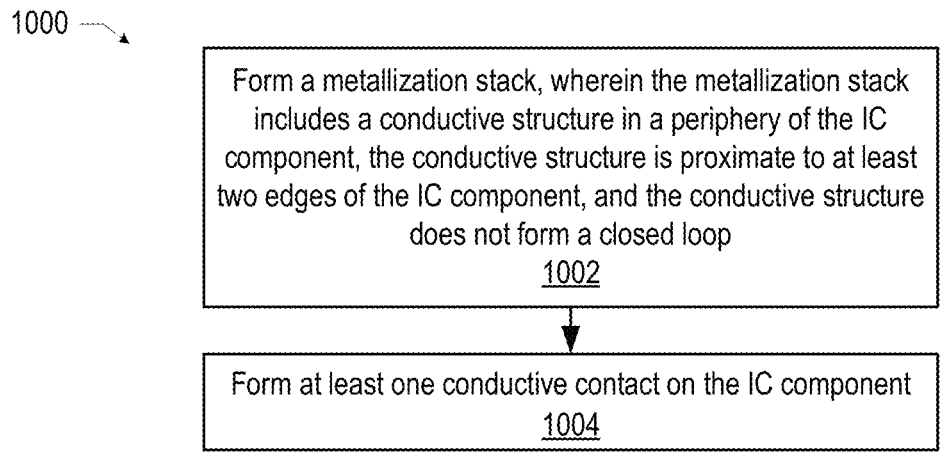
FIG. 9 is a flow diagram of a method of manufacturing a conductive structure in an integrated circuit (IC) component, in accordance with various embodiments.

FIG. 9 is a flow diagram of a method 1000 of manufacturing a conductive structure in an IC component, in accordance with various embodiments. Although the operations of the method 1000 may be illustrated with reference to particular embodiments of the peripheral inductors 110 in the dies 100 disclosed herein, the method 1000 may be used to form any suitable conductive structures (e.g., an electromagnetic shield, a heat sink or spreader, etc.) in any suitable IC component (e.g., a die, an interposer, or a package substrate, as discussed below). Operations are illustrated once each and in a particular order in FIG. 9, but the operations may be reordered and/or repeated as desired (e.g., with different operations performed in parallel when manufacturing multiple electronic components simultaneously).

At 1002, a metallization stack may be formed. The metallization stack may include a conductive structure in a periphery of the IC component, the conductive structure may be proximate to at least two edges of the IC component, and the conductive structure may not form a closed loop. For example, a conductive structure like any of the embodiments of the peripheral inductors 110 disclosed herein may be formed in a metallization stack 123 of a die 100 (or a package substrate 1652 or interposer 1704, discussed below). The conductive structure may be proximate to at least two edges 102 of a die 100 (or a package substrate 1652 or interposer 1704, discussed below), and the conductive structure may not form a closed loop (and instead may have ends 112). In some embodiments, the operations at 1002 may also include forming a guard ring in the metallization stack (e.g., in accordance with any of the embodiments of the guard ring 130 discussed herein).

At 1004, at least one conductive contact may be formed on the IC component. For example, at least one conductive contact 128 may be formed on a die 100 (or on a package substrate 1652 or an interposer 1704, discussed below). In some embodiments, the conductive structure may be electrically coupled to the at least one conductive contact.

The peripheral inductors 110 disclosed herein may be included in any suitable electronic component. FIGS. 10-14 illustrate various examples of apparatuses that may include any of the peripheral inductors 110 disclosed herein.

Figure 10:
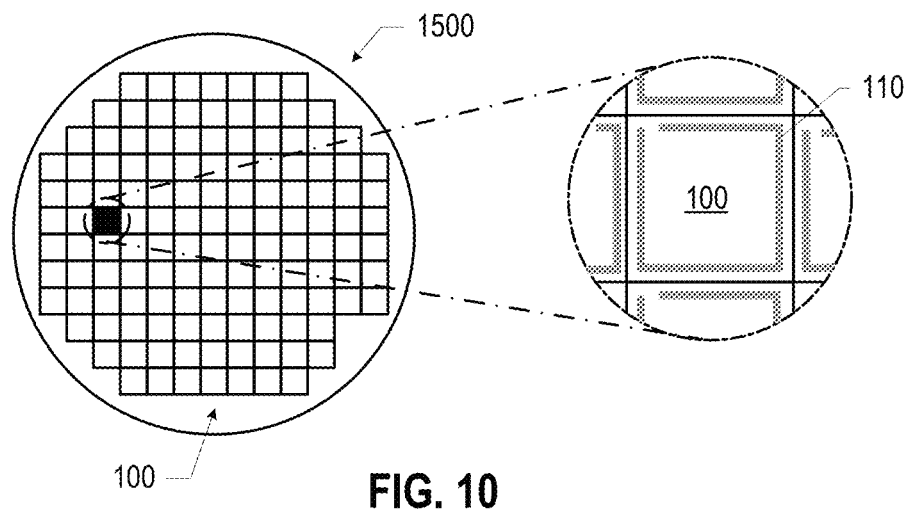
FIG. 10 is a top view of a wafer and dies that may include a peripheral inductor, in accordance with any of the embodiments disclosed herein.

FIG. 10 is a top view of a wafer 1500 and dies 100 that may include one or more peripheral inductors 110 or may be included in an IC package whose substrate includes one or more peripheral inductors 110 (e.g., as discussed below with reference to FIG. 12), in accordance with any of the embodiments disclosed herein. The wafer 1500 may be composed of semiconductor material and may include one or more dies 100 having IC structures formed on a surface of the wafer 1500. Each of the dies 100 may be a repeating unit of a semiconductor product that includes any suitable IC. After the fabrication of the semiconductor product is complete, the wafer 1500 may undergo a singulation process in which the dies 100 are separated from one another to provide discrete "chips" of the semiconductor product. The die 100 may include one or more peripheral inductors 110 (e.g., as discussed above and as discussed below with reference to FIG. 11) and circuitry 104, as well as any other IC components. In some embodiments, a memory array formed by multiple memory devices may be formed on a same die 100 as a processing device (e.g., the processing device 1802 of FIG. 14) or other logic that is configured to store information in the memory devices or execute instructions stored in the memory array.

Figure 11:
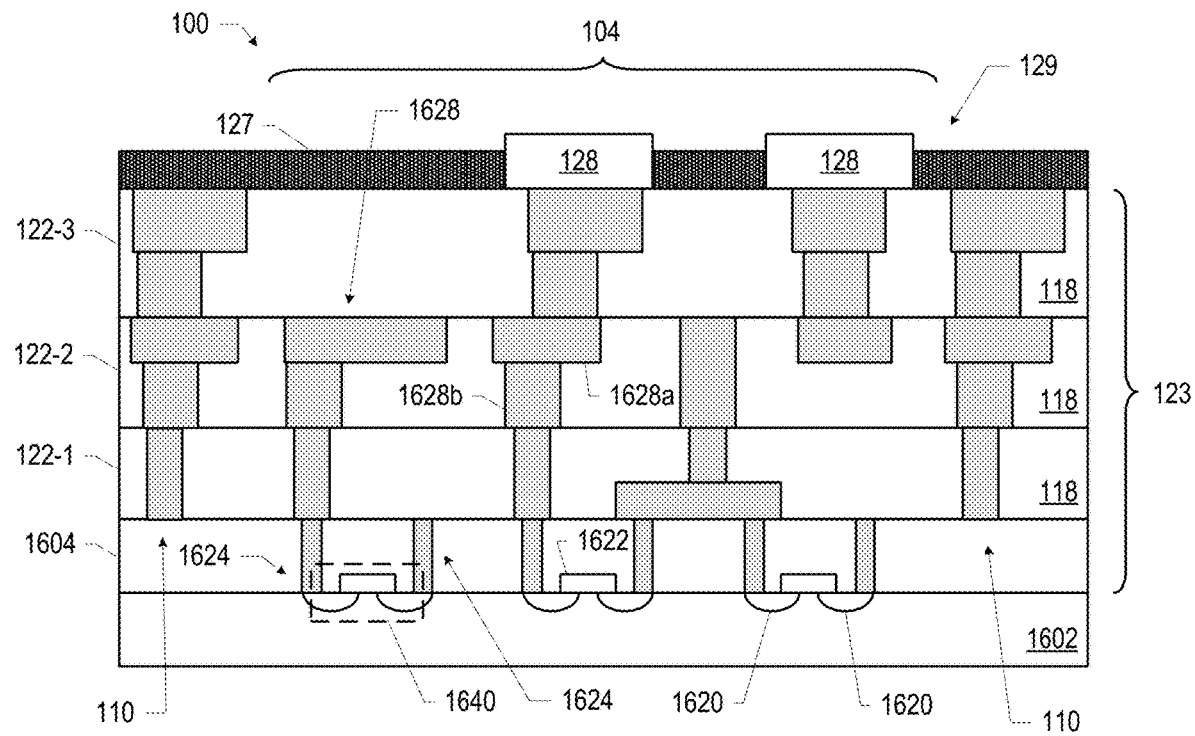
FIG. 11 is a cross-sectional side view of an IC device that may include a peripheral inductor, in accordance with any of the embodiments disclosed herein.

FIG. 11 is a cross-sectional side view of a portion of a die 100 that may include one or more peripheral inductors 110 or may be included in an IC package whose substrate includes one or more peripheral inductors 110 (e.g., as discussed below with reference to FIG. 12), in accordance with any of the embodiments disclosed herein. The die 100 may be formed on a substrate 1602 (e.g., the wafer 1500 of FIG. 10). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for a die 100 may be used.

The die 100 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 11 and may include a wide variety of other types and configurations such as, for example, planar transistors, non-planar transistors, or a combination of both. Non-planar transistors may include FinFET transistors, such as double-gate transistors or tri-gate transistors, and wraparound or all-around gate transistors, such as nanoribbon and nanowire transistors. The transistors 1640 in the device layer 1604 may be part of the circuitry 104 in the interior 129 of the peripheral inductor 110.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions

1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604, and/or to/from a peripheral inductor 110, through one or more interconnect layers 122 disposed on the device layer 1604 (illustrated in FIG. 11 as interconnect layers 122-1, 122-2, and 122-3). For example, electrically conductive features of the device layer 1604 (e.g., the gate 1622 and the S/D contacts 1624) may be electrically coupled with the interconnect structures 1628 of the interconnect layers 122. The one or more interconnect layers 122 may form a metallization stack 123 of the die 100.

As discussed above, a peripheral inductor 110 may be disposed in one or more of the interconnect layers 122, in accordance with any of the techniques disclosed herein (e.g., with reference to FIGS. 1-7). FIG. 11 illustrates a single peripheral inductor 110 in the interconnect layers 122 for illustration purposes, but any number and structure of peripheral inductors 110 may be included in any one or more of the layers in a metallization stack 123. One or more peripheral inductors 110 in the metallization stack 123 may be coupled to any suitable ones of the devices in the device layer 1604 and/or to one or more of the conductive contacts 128 (discussed below).

The interconnect structures 1628 may be arranged within the interconnect layers 122 to route electrical signals according to a wide variety of designs (in particular, the arrangement is not limited to the particular configuration of interconnect structures 1628 depicted in FIG. 11). Although a particular number of interconnect layers 122 is depicted in FIG. 11, embodiments of the present disclosure include IC devices having more or fewer interconnect layers 122 than depicted. The interconnect layers 122 may include a dielectric material 118, as shown, and may also include a nitride material (e.g., the nitride material 120), an adhesion liner, a diffusion barrier, etc.

In some embodiments, the interconnect structures 1628 may include conductive lines 1628a and/or conductive vias 1628b filled with an electrically conductive material such as a metal. In a particular interconnect layer, the conductive lines 1628a may be formed simultaneously with, and according to the same design rules as, the conductive lines 124a of the peripheral inductor 110, and the conductive vias 1628b may be formed simultaneously with, and according to the same design rules as, the conductive vias 124b of the peripheral inductor 110. The conductive lines 1628a may be arranged to route electrical signals in a direction of a plane that is substantially parallel with a surface of the substrate 1602 upon which the device layer 1604 is formed. For example, the conductive lines 1628a may route electrical signals in a direction in and out of the page from the perspective of FIG. 11. The conductive vias 1628b may be arranged to route electrical signals in a direction of a plane that is substantially perpendicular to the surface of the substrate 1602 upon which the device layer 1604 is formed. In some embodiments, the conductive vias 1628b may electrically couple conductive lines 1628a of different interconnect layers 122 together.

A first interconnect layer 122-1 (referred to as Metal 1 or "M1") may be formed directly on the device layer 1604. In some embodiments, the first interconnect layer 122-1 may include conductive lines 1628a and/or conductive vias 1628b, as shown. The conductive lines 1628a of the first interconnect layer 122-1 may be coupled with contacts (e.g., the S/D contacts 1624) of the device layer 1604.

A second interconnect layer 122-2 (referred to as Metal 2 or "M2") may be formed directly on the first interconnect layer 122-1. In some embodiments, the second interconnect layer 122-2 may include conductive vias 1628b to couple the conductive lines 1628a of the second interconnect layer 122-2 with the conductive lines 1628a of the first interconnect layer 122-1. Although the conductive lines 1628a and the conductive vias 1628b are structurally delineated with a line within each interconnect layer (e.g., within the second interconnect layer 122-2) for the sake of clarity, the conductive lines 1628a and the conductive vias 1628b may be structurally and/or materially contiguous (e.g., simultaneously filled during a dual Damascene process) in some embodiments.

A third interconnect layer 122-3 (referred to as Metal 3 or "M3") (and additional interconnect layers, as desired) may be formed in succession on the second interconnect layer 122-2 according to similar techniques and configurations described in connection with the second interconnect layer 122-2 or the first interconnect layer 122-1.

As discussed above with reference to FIG. 5, the die 100 may include a solder resist material 127 and one or more conductive contacts 128 formed on the interconnect layers 122. These elements may take any of the forms discussed above.

Figure 12:
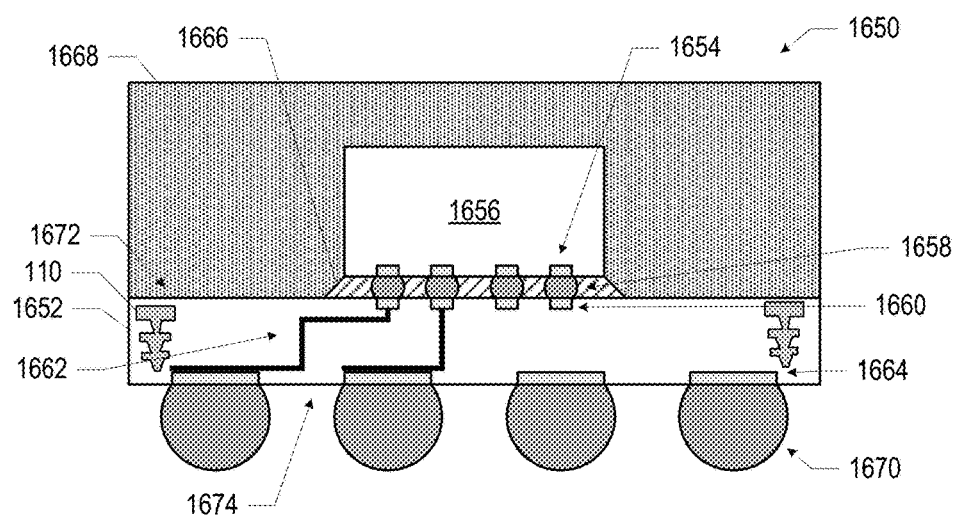
FIG. 12 is a cross-sectional side view of an IC package that may include a peripheral inductor, in accordance with various embodiments.

FIG. 12 is a cross-sectional view of an example IC package 1650 that may include one or more peripheral inductors 110 (not shown). The package substrate 1652 may be formed of a dielectric material and may have conductive pathways extending through the dielectric material between the face 1672 and the face 1674, between different locations on the face 1672, and/or between different locations on the face 1674. These conductive pathways may take the form of any of the interconnect structures 1628 discussed above with reference to FIG. 11. In some embodiments, the package substrate 1652 may include one or more peripheral inductors 110 in the periphery of the package substrate 1652. FIG. 12 illustrates a single peripheral inductor 110 in the package substrate 1652, but this number and location of peripheral inductors 110 in the IC package 1650 is simply illustrative, and any number of peripheral inductors 110 (with any suitable structure) may be included in a package substrate 1652. In some embodiments, no peripheral inductors 110 may be included in the package substrate 1652.

The IC package 1650 may include a die 1656 coupled to the package substrate 1652 via conductive contacts 1654 of the die 1656, first-level interconnects 1658, and conductive contacts 1660 of the package substrate 1652. The conductive contacts 1660 may be coupled to conductive pathways 1662 through the package substrate 1652, allowing circuitry within the die 1656 to electrically couple to various ones of the conductive contacts 1664 or to the peripheral inductors 110 (or to other devices included in the package substrate 1652, not shown). The first-level interconnects 1658 illustrated in FIG. 12 are solder bumps, but any suitable first-level interconnects 1658 may be used. As used herein, a "conductive contact" may refer to a portion of conductive material (e.g., metal) serving as an electrical interface between different components; conductive contacts may be recessed in, flush with, or extending away from a surface of a component and may take any suitable form (e.g., a conductive pad or socket).

In some embodiments, an underfill material 1666 may be disposed between the die 1656 and the package substrate 1652 around the first-level interconnects 1658, and a mold compound 1668 may be disposed around the die 1656 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 12 are solder balls (e.g., for a ball grid array arrangement), but any suitable second-level interconnects 1670 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 13.

The die 1656 may take the form of any of the embodiments of the die 100 discussed herein. In some embodiments, the die 1656 may include one or more peripheral inductors 110 (e.g., as discussed above with reference to FIG. 10 and FIG. 11); in other embodiments, the die 1656 may not include any peripheral inductors 110.

Although the IC package 1650 illustrated in FIG. 12 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although a single die 1656 is illustrated in the IC package 1650 of FIG. 12, an IC package 1650 may include multiple dies 1656 (e.g., with one or more of the multiple dies 1656 coupled to peripheral inductors 110 included in the package substrate 1652). An IC package 1650 may include additional passive components, such as surface-mount resistors, capacitors, and inductors disposed on the first face 1672 or the second face 1674 of the package substrate 1652. More generally, an IC package 1650 may include any other active or passive components known in the art.

Figure 13:
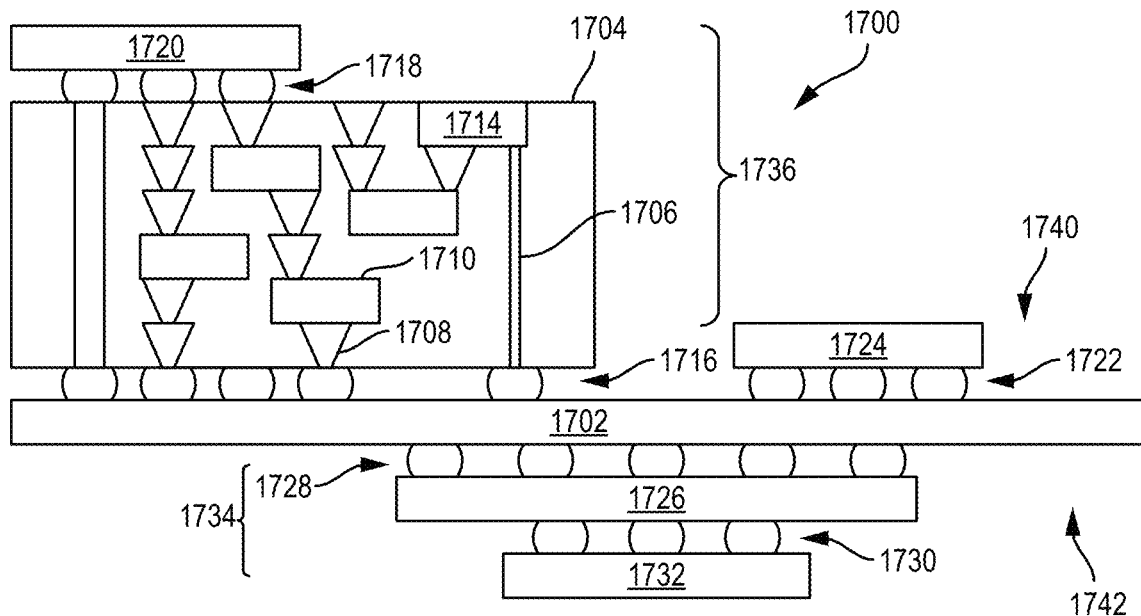
FIG. 13 is a cross-sectional side view of an IC device assembly that may include a peripheral inductor, in accordance with any of the embodiments disclosed herein.

FIG. 13 is a cross-sectional side view of an IC device assembly 1700 that may include one or more IC packages or other electronic components (e.g., a die) including one or more peripheral inductors 110, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 12 (e.g., may include one or more peripheral inductors 110 in a package substrate 1652 or in a die).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 13 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702 and may include solder balls (as shown in FIG. 13), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 13, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 100 of FIG. 10), an IC device (e.g., the die 100 of FIG. 11), or any other suitable component. Generally, the interposer 1704 may spread a connection to a wider pitch or reroute a connection to a different connection. For example, the interposer 1704 may couple the IC package 1720 (e.g., a die) to a set of BGA conductive contacts of the coupling components 1716 for coupling to the circuit board 1702. In the embodiment illustrated in FIG. 13, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including, but not limited to, through-silicon vias (TSVs) 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art. In some embodiments, the interposer 1704 may include one or more peripheral inductors 110.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 13 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 14:
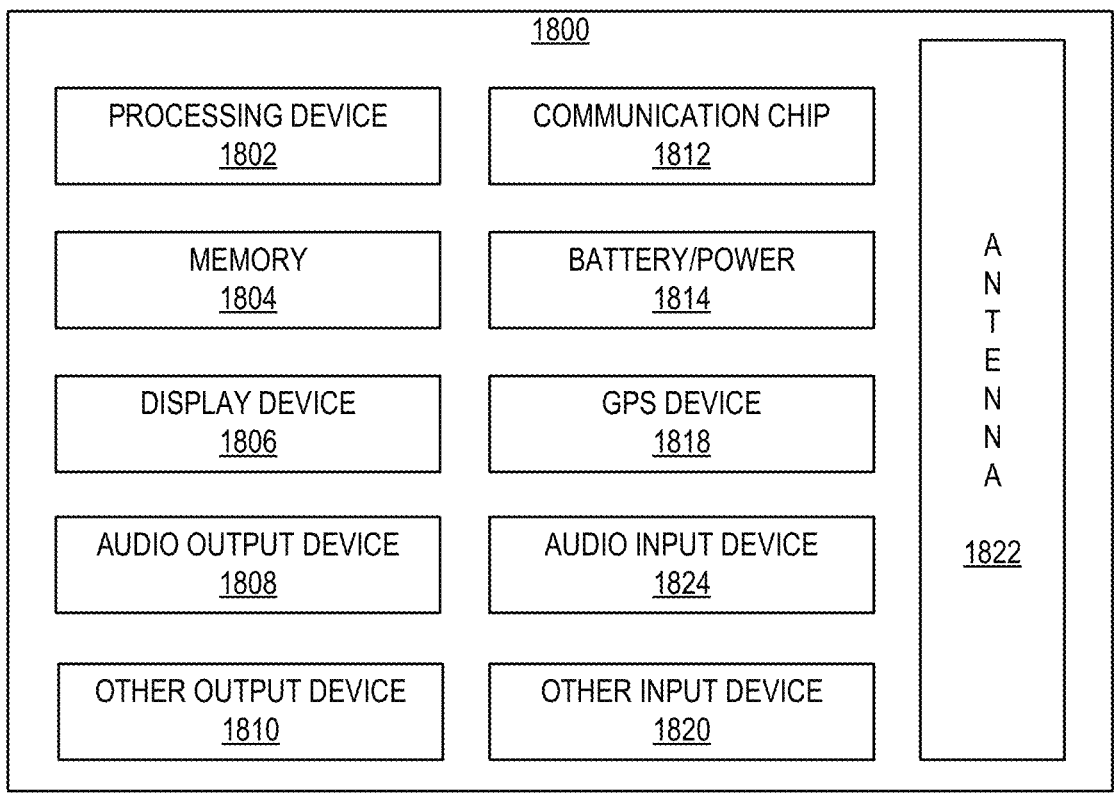
FIG. 14 is a block diagram of an example computing device that may include a peripheral inductor, in accordance with any of the embodiments disclosed herein.

FIG. 14 is a block diagram of an example computing device 1800 that may include one or more peripheral inductors 110, in accordance with any of the embodiments disclosed herein. For example, any suitable ones of the components of the computing device 1800 may include one or more of the IC packages 1650 or dies 100 disclosed herein. A number of components are illustrated in FIG. 14 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system-on-a-chip (SoC) die.

Additionally, in various embodiments, the computing device 1800 may not include one or more of the components illustrated in FIG. 14, but the computing device 1800 may include interface circuitry for coupling to the one or more components. For example, the computing device 1800 may not include a display device 1806 but may include display device interface circuitry (e.g., a connector and driver circuitry) to which a display device 1806 may be coupled. In another set of examples, the computing device 1800 may not include an audio input device 1824 or an audio output device 1808 but may include audio input or output device interface circuitry (e.g., connectors and supporting circuitry) to which an audio input device 1824 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The computing device 1800 may include an audio output device 1808 (or corresponding interface circuitry, as discussed above). The audio output device 1808 may include any device that generates an audible indicator, such as speakers, headsets, or earbuds.

The computing device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The computing device 1800 may include a GPS device 1818 (or corresponding interface circuitry, as discussed above). The GPS device 1818 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1800 may be any other electronic device that processes data.

The following paragraphs provide various examples of the embodiments disclosed herein.

Example 1 is an integrated circuit (IC) device, including a die including an inductor extending around at least a portion of a periphery of the die.

Example 2 may include the subject matter of Example 1, and may further specify that the inductor is included in a metallization stack of the die.

Example 3 may include the subject matter of Example 2, and may further specify that the inductor has a first end in a first layer of the metallization stack, the inductor has a second end in a second layer of the metallization stack, and the first layer is different from the second layer.

Example 4 may include the subject matter of Example 3, and may further specify that the inductor forms a spiral through a thickness of the die.

Example 5 may include the subject matter of any of Examples 2-4, and may further specify that the inductor has a first end that spans multiple interconnect layers of the metallization stack.

Example 6 may include the subject matter of any of Examples 1-5, and may further specify that the die further includes an insulating material at a first end of the inductor.

Example 7 may include the subject matter of Example 6, and may further specify that the insulating material includes a nitride.

Example 8 may include the subject matter of any of Examples 6-7, and may further specify that the inductor and the insulating material provide a hermetic seal for the die.

Example 9 may include the subject matter of any of Examples 6-8, and may further specify that the insulating material includes an oxide.

Example 10 may include the subject matter of any of Examples 1-9, and may further specify that the die further includes a guard ring extending around the periphery of the die, and the inductor is in an interior of the guard ring.

Example 11 may include the subject matter of Example 10, and may further specify that the guard ring provides a hermetic seal for the die.

Example 12 may include the subject matter of any of Examples 10-11, and may further specify that the guard ring includes conductive lines and conductive vias in a metallization stack of the die.

Example 13 may include the subject matter of any of Examples 1-12, and may further specify that the inductor includes conductive lines and conductive vias in a metallization stack of the die.

Example 14 may include the subject matter of any of Examples 1-13, and may further specify that the die further includes circuitry in an interior of the inductor.

Example 15 may include the subject matter of Example 14, and may further specify that the circuitry includes a buck-boost converter.

Example 16 may include the subject matter of any of Examples 14-15, and may further specify that a first end of the inductor is electrically coupled to the circuitry.

Example 17 may include the subject matter of any of Examples 1-16, and may further specify that the die further includes conductive contacts, and a first end of the inductor is electrically coupled to a conductive contact.

Example 18 is a die, including: a conductive structure in a periphery of the die, wherein the conductive structure is proximate to at least two edges of the die, and the conductive structure does not form a closed loop; and circuitry in an interior of the conductive structure.

Example 19 may include the subject matter of Example 18, and may further specify that the conductive structure is included in a metallization stack of the die.

Example 20 may include the subject matter of Example 19, and may further specify that the conductive structure has a first end in a first layer of the metallization stack, the conductive structure has a second end in a second layer of the metallization stack, and the first layer is different from the second layer.

Example 21 may include the subject matter of Example 20, and may further specify that the conductive structure forms a spiral through a thickness of the die.

Example 22 may include the subject matter of any of Examples 19-21, and may further specify that the conductive structure has a first end that spans multiple interconnect layers of the metallization stack.

Example 23 may include the subject matter of any of Examples 18-22, and may further include an insulating material at a first end of the conductive structure.

Example 24 may include the subject matter of Example 23, and may further specify that the insulating material includes a nitride.

Example 25 may include the subject matter of any of Examples 23-24, and may further specify that the conductive structure and the insulating material provide a hermetic seal for the die.

Example 26 may include the subject matter of any of Examples 23-25, and may further specify that the insulating material includes an oxide.

Example 27 may include the subject matter of any of Examples 18-26, and may further include a guard ring extending around the periphery of the die, wherein the conductive structure is in an interior of the guard ring.

Example 28 may include the subject matter of Example 27, and may further specify that the guard ring provides a hermetic seal for the die.

Example 29 may include the subject matter of any of Examples 27-28, and may further specify that the guard ring includes conductive lines and conductive vias in a metallization stack of the die.

Example 30 may include the subject matter of any of Examples 18-29, and may further specify that the conductive structure includes conductive lines and conductive vias in a metallization stack of the die.

Example 31 may include the subject matter of any of Examples 18-30, and may further specify that the circuitry includes power converter circuitry.

Example 32 may include the subject matter of any of Examples 18-31, and may further specify that a first end of the conductive structure is electrically coupled to the circuitry.

Example 33 may include the subject matter of any of Examples 18-32, and may further include conductive contacts at a face of the die, wherein a first end of the conductive structure is electrically coupled to a conductive contact.

Example 34 is a method of manufacturing a conductive structure in an integrated circuit (IC) component, including: forming a metallization stack, wherein the metallization stack includes a conductive structure in a periphery of the IC component, the conductive structure is proximate to at least two edges of the IC component, and the conductive structure does not form a closed loop; and forming at least one conductive contact on the IC component.

Example 35 may include the subject matter of Example 34, and may further specify that the metallization stack includes a conductive pathway between a first end of the conductive structure and a conductive contact.

Example 36 may include the subject matter of any of Examples 34-35, and may further specify that the IC component is a die, and the metallization stack further includes interconnect structures to transistors in a device layer of the die.

Example 37 may include the subject matter of Example 36, and may further specify that the metallization stack includes a conductive pathway between a first end of the conductive structure and the interconnect structures.

Example 38 may include the subject matter of any of Examples 34-37, and may further specify that the conductive structure has a spiral shape.

Example 39 may include the subject matter of any of Examples 34-38, and may further specify that the conductive structure includes conductive lines and conductive vias.

Example 40 may include the subject matter of any of Examples 34-39, and may further specify that the conductive structure spans multiple interconnect layers of the metallization stack.

Example 41 may include the subject matter of any of Examples 34-40, and may further specify that forming the metallization stack further includes forming a guard ring around the periphery of the IC component to hermetically seal the IC component.

Example 42 may include the subject matter of any of Examples 34-41, and may further specify that the IC component is a package substrate or an interposer.

Example 43 is a computing device, including: an integrated circuit (IC) package, wherein the IC package includes a die, and the die includes an inductor extending around at least a portion of a periphery of the die, and a circuit board, wherein the IC package is coupled to the circuit board.

Example 44 may include the subject matter of Example 43, and may further specify that the IC package is a flip chip package.

Example 45 may include the subject matter of any of Examples 43-44, and may further include a wireless communications device.

Example 46 may include the subject matter of any of Examples 43-45, and may further specify that the computing device is a mobile computing device.

The invention claimed is:

1. An integrated circuit (IC) device comprising a die, the die comprising:
   an inductor extending around at least a portion of a periphery of the die, the inductor having a first end and a second end;
   an insulating material that separates the first end of the inductor from the second end of the inductor; and
   circuitry in an interior of the inductor, the circuitry comprising a plurality of transistors, wherein the first end of the inductor is electrically coupled to the circuitry in the interior of the inductor, and a footprint of the circuitry is inside a footprint of the inductor.

2. The IC device of claim 1, wherein the inductor is included in a metallization stack of the die.

3. The IC device of claim 2, wherein the inductor has the first end in a first layer of the metallization stack, the inductor has the second end in a second layer of the metallization stack, and the first layer is different from the second layer.

4. The IC device of claim 2, wherein the first end of the inductor spans multiple interconnect layers of the metallization stack.

5. The IC device of claim 1, wherein the inductor and insulating material provide a hermetic seal for the die.

6. The IC device of claim 1, wherein the circuitry includes a buck-boost converter.

7. The IC device of claim 1, wherein the second end of the inductor is electrically coupled to the circuitry in the interior of the inductor.

8. The IC device of claim 1, wherein the die further includes conductive contacts, and the first end of the inductor is electrically coupled to a conductive contact.

9. A die, comprising:
- a conductive structure in a periphery of the die, the conductive structure having a first end and a second end, wherein the conductive structure is proximate to at least two edges of the die, and the conductive structure does not form a closed loop;
- an insulating material that separates the first end of the conductive structure from the second end of the conductive structure; and
- circuitry in an interior of the conductive structure, the circuitry comprising a plurality of transistors, wherein the first end of the conductive structure is electrically coupled to the circuitry in the interior of the conductive structure, and a footprint of the circuitry is inside a footprint of the conductive structure.

10. The die of claim 9, wherein the insulating material includes a nitride.

11. The die of claim 9, wherein the conductive structure and the insulating material provide a hermetic seal for the die.

12. The die of claim 9, further comprising:
- a guard ring extending around the periphery of the die, wherein the conductive structure is in an interior of the guard ring.

13. The die of claim 12, wherein the guard ring provides a hermetic seal for the die.

14. The die of claim 9, further comprising:
- conductive contacts at a face of the die, wherein the second end of the conductive structure is electrically coupled to a conductive contact.

15. A computing device, comprising:
- an integrated circuit (IC) package, wherein the IC package includes a die, and the die includes an inductor extending around at least a portion of a periphery of the die, the inductor having a first end and a second end, and the die further includes:
  - an insulating material that separates the first end of the inductor from the second end of the inductor, and
  - circuitry in an interior of the inductor, the circuitry comprising a plurality of transistors, wherein the first end of the inductor is electrically coupled to the circuitry in the interior of the inductor, and a footprint of the circuitry is inside a footprint of the inductor; and
- a circuit board, wherein the IC package is coupled to the circuit board.

16. The computing device of claim 15, wherein the IC package is a flip chip package.

17. The computing device of claim 15, further comprising:
- a wireless communications device.

* * * * *